(12) United States Patent
Camacho et al.

(10) Patent No.: US 9,330,994 B2
(45) Date of Patent: May 3, 2016

(54) SEMICONDUCTOR DEVICE AND METHOD OF FORMING RDL AND VERTICAL INTERCONNECT BY LASER DIRECT STRUCTURING

(71) Applicant: STATS ChipPAC, Ltd., Singapore (SG)

(72) Inventors: Zigmund R. Camacho, Singapore (SG); Bartholomew Liao, Singapore (SG); Sheila Marie L. Alvarez, Singapore (SG); HeeJo Chi, Kyoungki-do (KR); Kelvin Dao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/228,531

(22) Filed: Mar. 28, 2014

(65) Prior Publication Data
US 2015/0279778 A1 Oct. 1, 2015

(51) Int. Cl.
*H01L 23/48* (2006.01)
*H01L 23/52* (2006.01)
*H01L 29/40* (2006.01)
*H01L 23/31* (2006.01)
*H01L 21/56* (2006.01)
(Continued)

(52) U.S. Cl.
CPC ........ *H01L 23/3107* (2013.01); *H01L 21/4846* (2013.01); *H01L 21/56* (2013.01); *H01L 21/76802* (2013.01); *H01L 21/76877* (2013.01); *H01L 21/76895* (2013.01); *H01L 23/49816* (2013.01); *H01L 23/49822* (2013.01); *H01L 23/49827* (2013.01); *H01L 23/5389* (2013.01); *H01L 23/562* (2013.01); *H01L 24/11* (2013.01); *H01L 24/13* (2013.01); *H01L 2224/12105* (2013.01); *H01L 2224/13023* (2013.01); *H01L 2924/12041* (2013.01); *H01L 2924/12042* (2013.01); *H01L 2924/13091* (2013.01); *H01L 2924/181* (2013.01)

(58) Field of Classification Search
CPC ..... H01L 24/96; H01L 21/563; H01L 21/565; H01L 23/3107; H01L 24/30; H01L 24/33
See application file for complete search history.

(56) References Cited

U.S. PATENT DOCUMENTS 7,759,246 B2  7/2010  Matsuki et al.
8,456,018 B2  6/2013  Park et al.
(Continued)

FOREIGN PATENT DOCUMENTS

EP  1274288 B1  3/2005

*Primary Examiner* — Thanh Y Tran
(74) *Attorney, Agent, or Firm* — Robert D. Atkins; Patent Law Group: Atkins and Associates, P.C.

(57) ABSTRACT

A semiconductor device has a semiconductor die and encapsulant deposited over the semiconductor die. An insulating layer is formed over the semiconductor die and encapsulant. A first channel including a first conductive surface is formed in the insulating layer by laser radiation. A laser-activated catalyst is infused in the insulating layer to form the first conductive surface in the first channel upon laser radiation. A vertical interconnect is formed through the encapsulant. A first conductive layer is formed in the first channel over the first conductive surface. A second channel including a second conductive surface is formed in the encapsulant by laser radiation. The catalyst is infused in the encapsulant to form the second conductive surface in the second channel upon laser radiation. A second conductive layer is formed in the second channel over the second conductive surface. An interconnect structure is formed over the first conductive layer.

21 Claims, 18 Drawing Sheets

(51) Int. Cl.
*H01L 21/768* (2006.01)
*H01L 23/00* (2006.01)
*H01L 23/498* (2006.01)
*H01L 21/48* (2006.01)
*H01L 23/538* (2006.01)

(56) References Cited

U.S. PATENT DOCUMENTS

| | | |
|---|---|---|
| 2004/0241422 A1 | 12/2004 | Naundorf et al. |
| 2008/0158838 A1* | 7/2008 | Inagaki et al. ............... 361/761 |
| 2009/0039496 A1* | 2/2009 | Beer et al. ..................... 257/693 |
| 2009/0292051 A1 | 11/2009 | Li et al. |
| 2011/0068481 A1* | 3/2011 | Park et al. ..................... 257/777 |
| 2011/0233754 A1* | 9/2011 | Meyer-Berg ............ H01L 21/56 257/693 |
| 2012/0231582 A1* | 9/2012 | Meyer-Berg ........... H01L 21/565 438/107 |
| 2013/0154108 A1* | 6/2013 | Lin ..................... H01L 23/5389 257/774 |
| 2013/0186676 A1* | 7/2013 | Yu .......................... H05K 1/186 174/257 |
| 2014/0138788 A1* | 5/2014 | Kim et al. ..................... 257/433 |

* cited by examiner

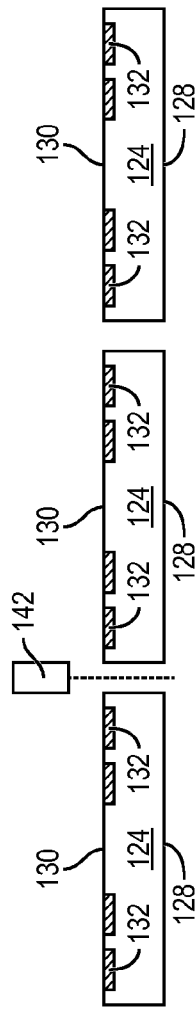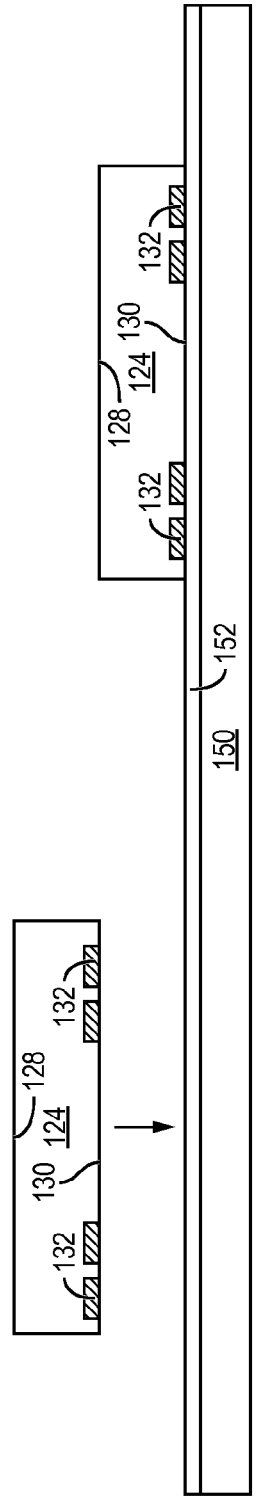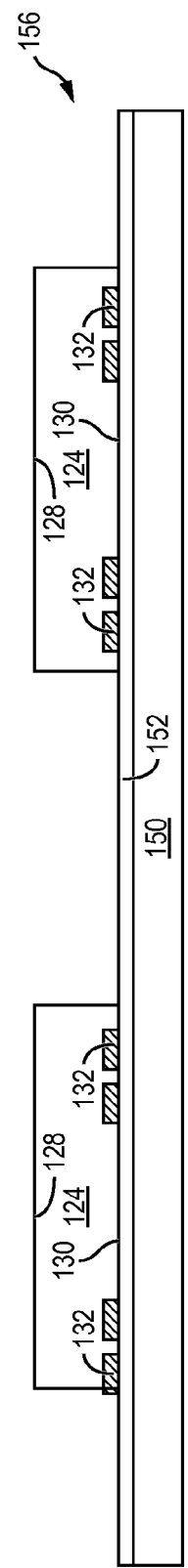

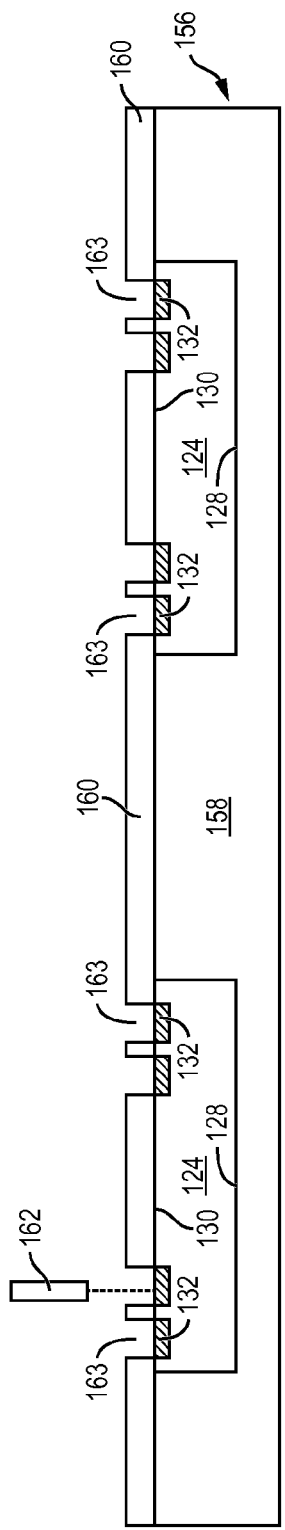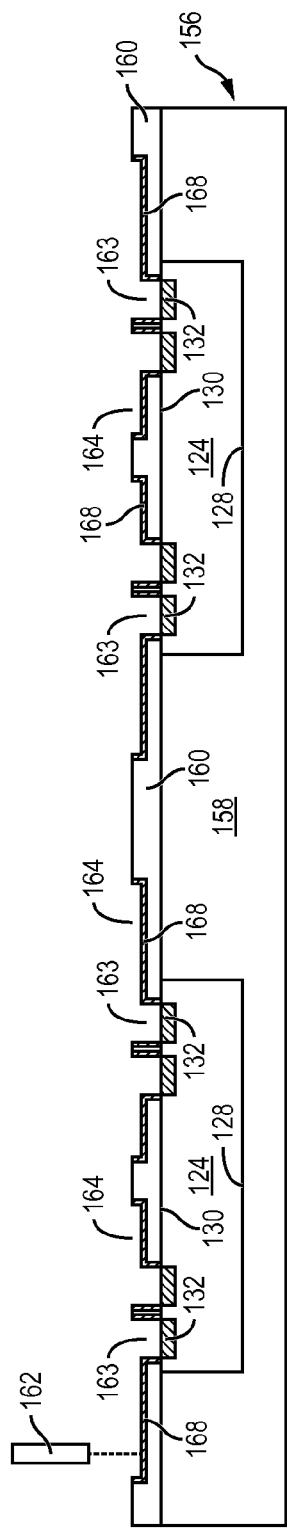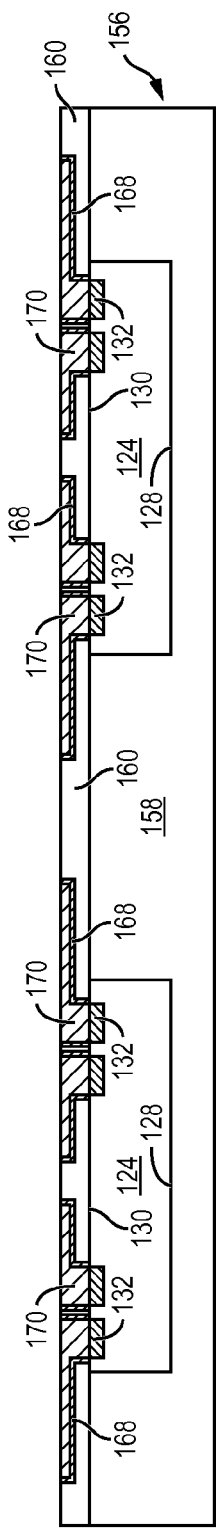

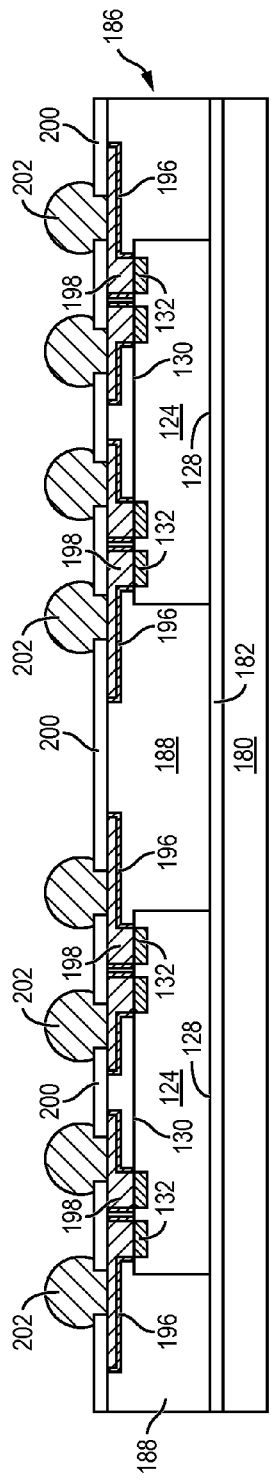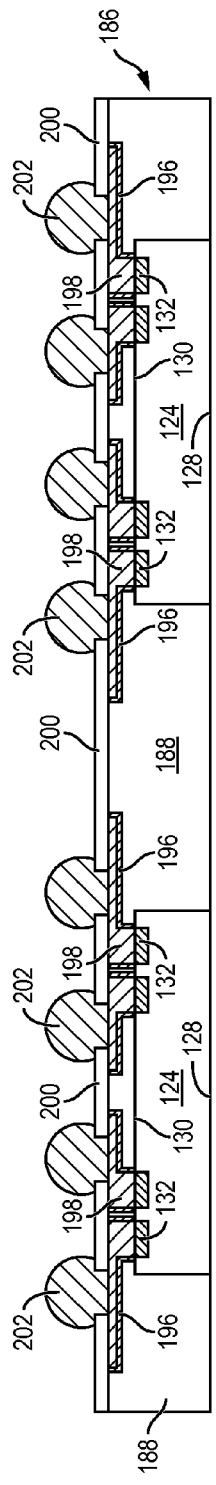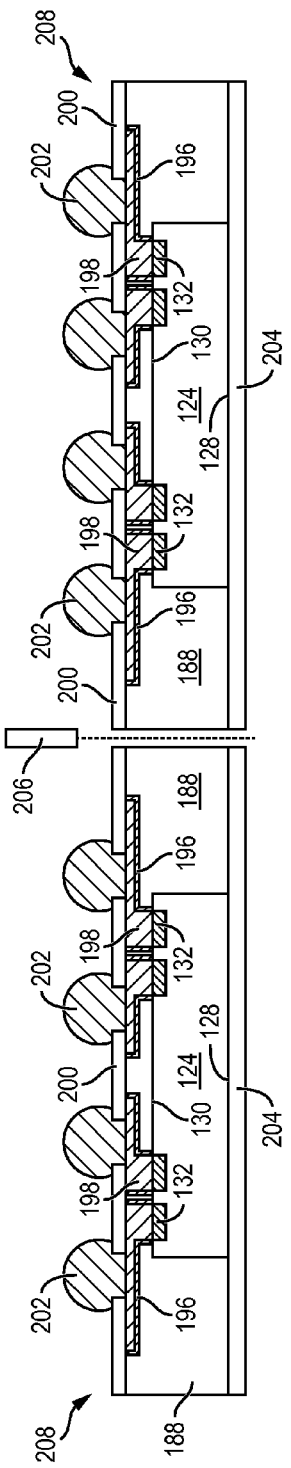

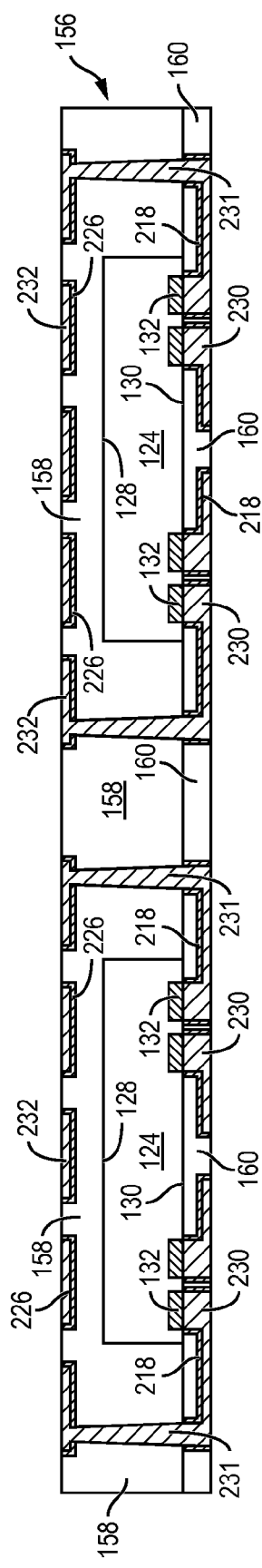
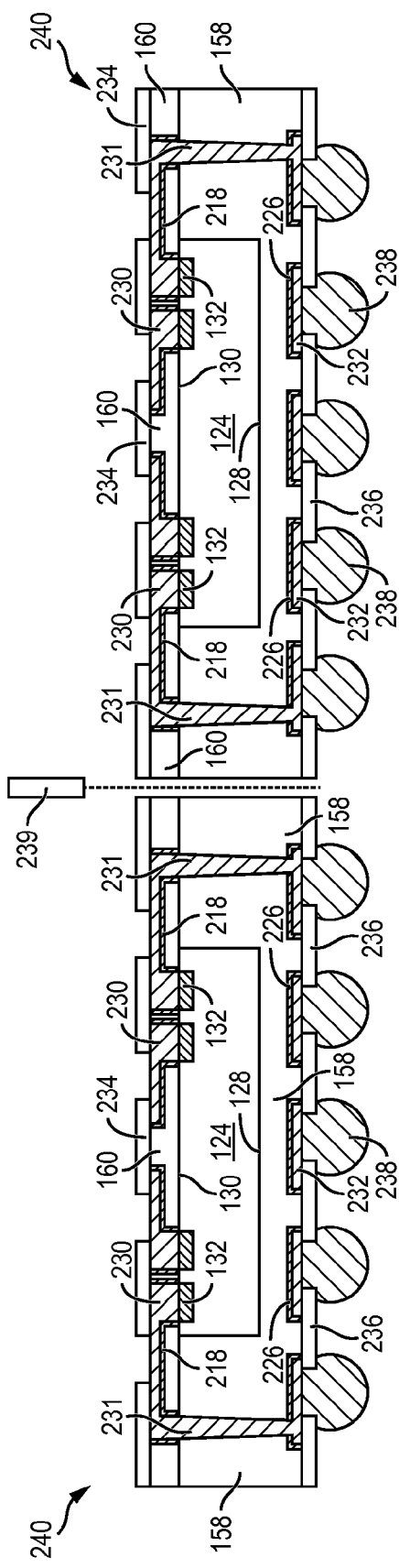
FIG. 9d
FIG. 9e

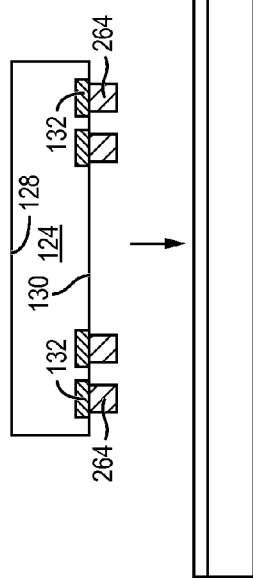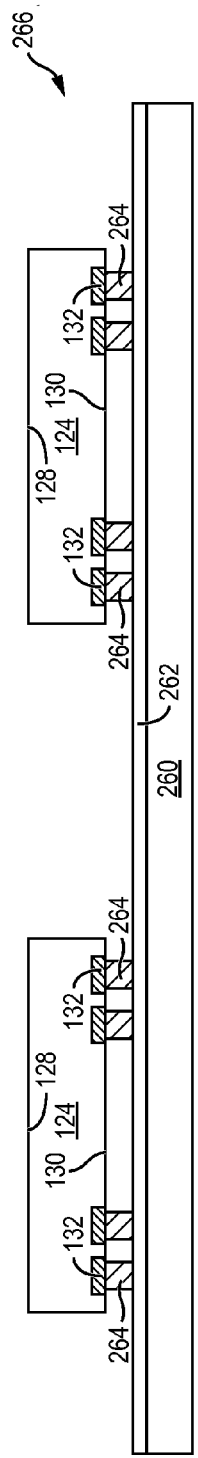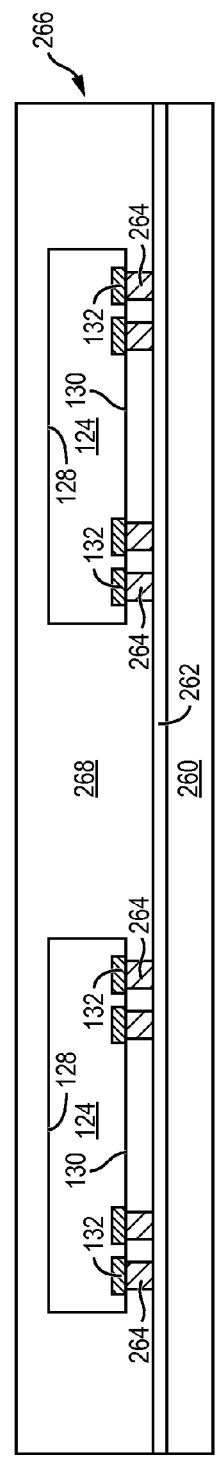

SEMICONDUCTOR DEVICE AND METHOD OF FORMING RDL AND VERTICAL INTERCONNECT BY LASER DIRECT STRUCTURING

FIELD OF THE INVENTION

The present invention relates in general to semiconductor devices and, more particularly, to a semiconductor device and method of forming an RDL and vertical interconnect by laser direct structuring (LDS) over a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A semiconductor die is typically encapsulated and an interconnect structure is formed over the die and encapsulant. FIG. 1a shows semiconductor die 10 covered by encapsulant 12. An insulating layer 14 is formed over semiconductor die 10 and encapsulant 12. A portion of insulating layer 14 is removed by a patterning and etching process, e.g., using photolithography, to form openings or vias 16 and expose contact pads 18 of semiconductor die 10.

In FIG. 1b, a conductive layer or redistribution layer (RDL) 20 is formed over insulating layer 14 and into openings 16 to make electrical connection to contact pads 18. RDL 20 can be formed by a first full surface electroless plated Cu seed layer 20a followed by a dry film resist (DFR) coating which is exposed and developed. A second Cu layer 20b is electrolytic plated within the developed portions of the DFR coating over the Cu seed layer. The DFR coating is then removed, as well as the full surface Cu seed layer outside the RDL pattern. An insulating layer 22, such as solder resist, is formed over insulating layer 14 and RDL 20. A portion of insulating layer 22 is removed by a patterning and etching process to expose RDL 20. Bumps 24 are formed over the exposed RDL 20. Accordingly, interconnect structure 26 formed over semiconductor die 10 and encapsulant 12 includes insulating layer 14, RDL 20, insulating layer 22, and bumps 24.

The formation of interconnect structure 26 involves multiple insulating layers, Cu seed layer, adhesion layer, masking, wet chemical etching, and multiple plating steps. The variety of photolithography processes used to form interconnect structure 26 adds time and expense to the manufacturing process and tends to reduce registration tolerances, alignment compensation, and flexibility in pattern adjustments.

SUMMARY OF THE INVENTION

A need exists for a cost effective process of forming RDL and vertical interconnect using LDS to avoid the shortcomings of the steps involved in photolithography. Accordingly, in one embodiment, the present invention is a method of making a semiconductor device comprising the steps of providing a semiconductor die, depositing an encapsulant over the semiconductor die, forming an insulating layer over the semiconductor die and encapsulant, forming a first channel including a first conductive surface in the insulating layer by laser radiation, forming a first conductive layer in the first channel over the first conductive surface, and forming an interconnect structure over the first conductive layer.

In another embodiment, the present invention is a method of making a semiconductor device comprising the steps of providing a semiconductor die, depositing an encapsulant over the semiconductor die, forming a first channel in the encapsulant by laser radiation, forming a first conductive layer in the first channel of the encapsulant, and forming an interconnect structure over the first conductive layer.

In another embodiment, the present invention is a method of making a semiconductor device comprising the steps of providing a semiconductor die, depositing an insulating material over the semiconductor die, forming a first channel in the insulating material by laser radiation, and forming a first conductive layer in the first channel of the insulating material.

In another embodiment, the present invention is a semiconductor device comprising a semiconductor die and insulating material deposited over the semiconductor die including a first channel formed in the insulating material by laser radiation. A first conductive layer is formed in the first channel of the insulating material.

BRIEF DESCRIPTION OF THE DRAWINGS

FIGS. 3a-3d illustrate a semiconductor wafer with a plurality of semiconductor die separated by a saw street;

FIGS. 4a-4j illustrate a method of forming an RDL in an insulating layer by LDS over a semiconductor die;

FIGS. 6a-6i illustrate a method of forming an RDL in encapsulant by LDS over a semiconductor die;

FIGS. 9a-9e illustrate a method of forming an RDL and vertical interconnect in an insulating layer and encapsulant by LDS over a semiconductor die;

FIGS. 14a-14i illustrate a method of forming an RDL and vertical interconnect in an encapsulant by LDS over a semiconductor die with conductive pillars;

DETAILED DESCRIPTION OF THE DRAWINGS

Figure 1A:
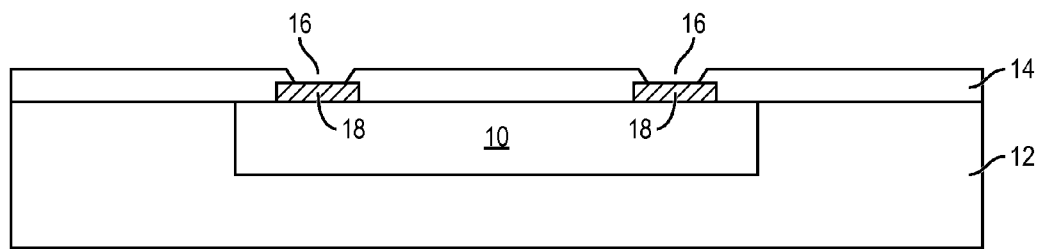
FIGS. 1a-1b illustrate a conventional semiconductor package with an RDL formed by photolithography processes.

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
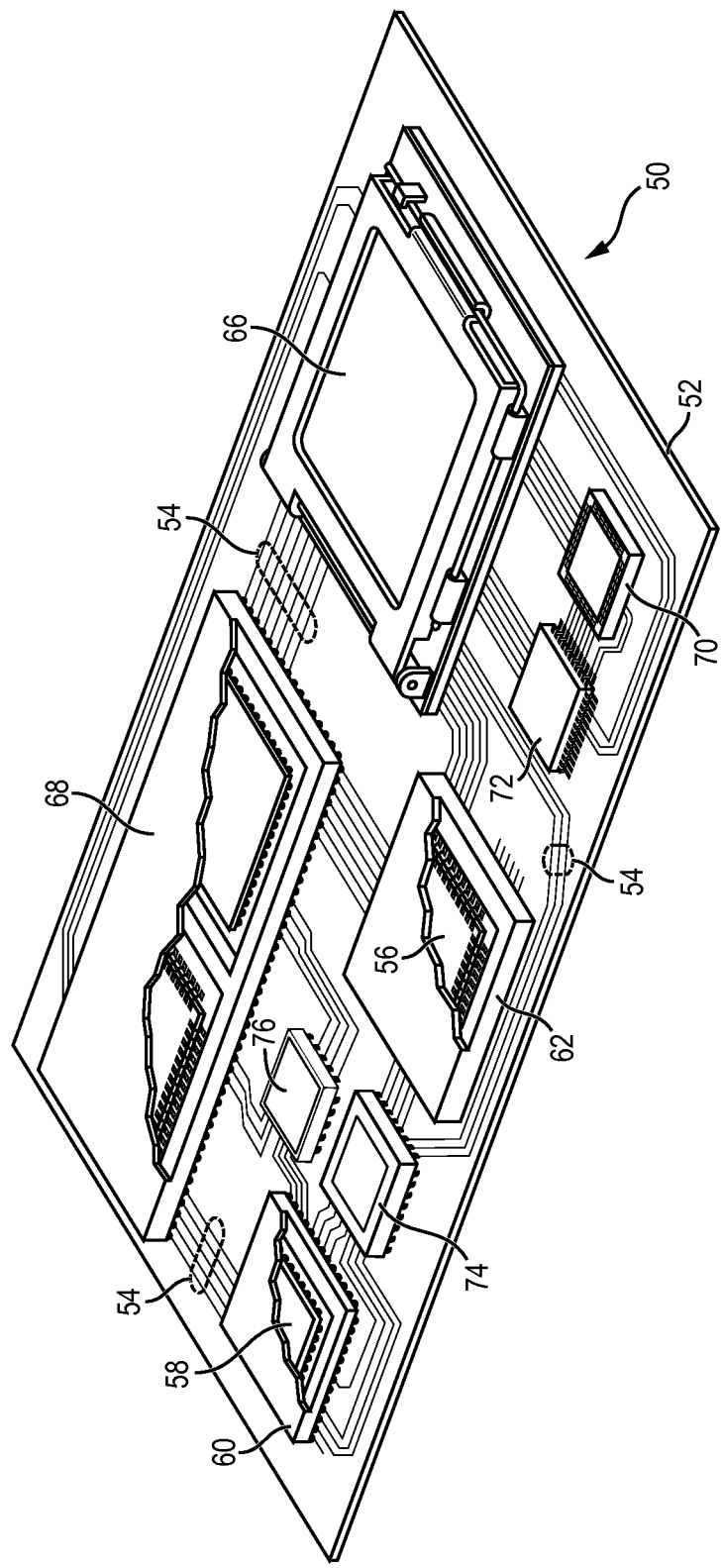
FIG. 2 illustrates a printed circuit board (PCB) with different types of packages mounted to a surface of the PCB.

FIG. 2 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. The eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
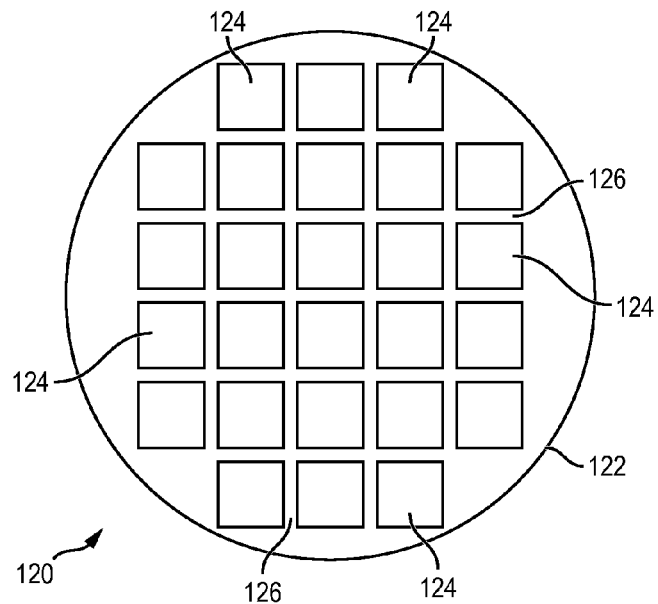

FIG. 3a shows a semiconductor wafer 120 with a base substrate material 122, such as silicon, germanium, aluminum phosphide, aluminum arsenide, gallium arsenide, gallium nitride, indium phosphide, silicon carbide, or other bulk semiconductor material for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 has a width or diameter of 200-300 millimeters (mm). In another embodiment, semiconductor wafer 120 has a width or diameter of 100-450 mm.

Figure 3B:
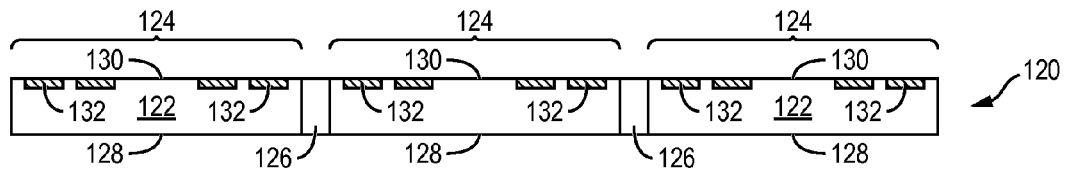

FIG. 3b shows a cross-sectional view of a portion of semiconductor wafer 120. Each semiconductor die 124 has a back or non-active surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of aluminum (Al), copper (Cu), tin (Sn), nickel (Ni), gold (Au), silver (Ag), titanium (Ti) or other suitable electrically conductive material. In one embodiment, Ti is formed over Al by sputtering for later Cu plating. Other metal layers compatible with Cu plating can also be used to form conductive layer 132. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

Figure 3C:
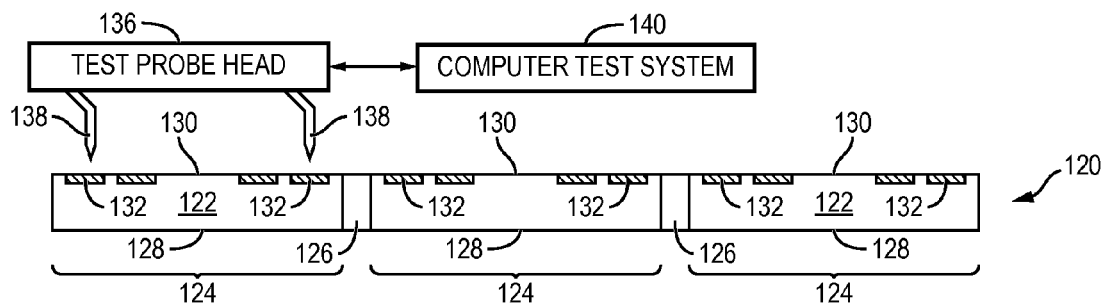

The active and passive components within semiconductor die 124 undergo testing at the wafer level for electrical performance and circuit function. Each semiconductor die 124 is tested for functionality and electrical parameters, as shown in FIG. 3c, using a test probe head 136 including a plurality of probes or test leads 138, or other testing device. Probes 138 are used to make electrical contact with nodes or contact pads 132 on each semiconductor die 124 and provide electrical stimuli to the contact pads. Semiconductor die 124 responds to the electrical stimuli, which is measured by computer test system 140 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 3d, semiconductor wafer 120 is singulated through saw street 126 using a saw blade or laser cutting tool 142 into individual semiconductor die 124. The individual semiconductor die 124 can be inspected and electrically tested for identification of KGD post singulation.

Figure 1B:
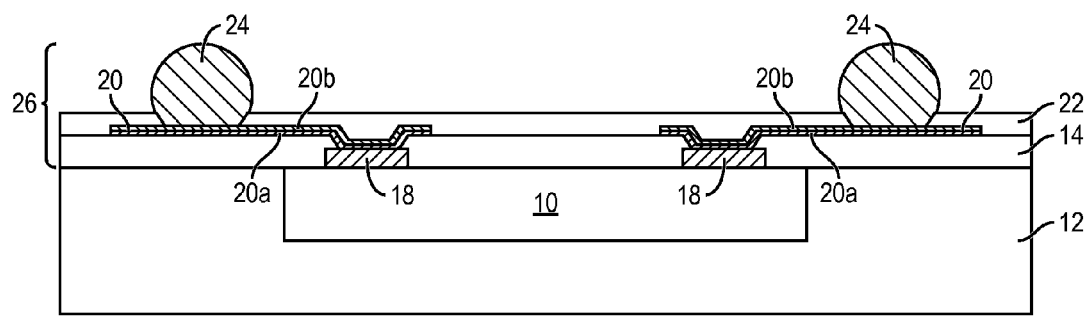
Figure 4C:
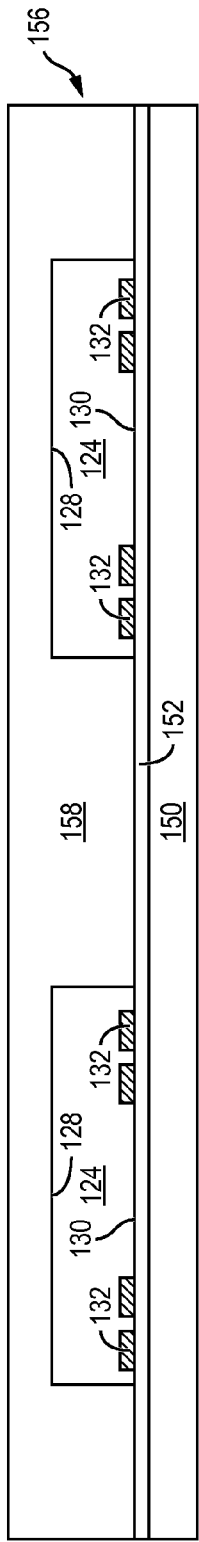

FIGS. 4a-4j illustrate, in relation to FIG. 1, a process of forming an RDL and vertical interconnect in an insulating layer by LDS over semiconductor die 124. FIG. 4a shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer.

Carrier 150 can be a round or rectangular panel (greater than 300 mm) with capacity for multiple semiconductor die 124. Carrier 150 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 150 is selected independent of the size of semiconductor die 124 or size of semiconductor wafer 120. That is, carrier 150 has a fixed or standardized size, which can accommodate various size semiconductor die 124 singulated from one or more semiconductor wafers 120. In one embodiment, carrier 150 is circular with a diameter of 330 mm. In another embodiment, carrier 150 is rectangular with a width of 560 mm and length of 600 mm. Semiconductor die 124 may have dimensions of 10 mm by 10 mm, which are placed on the standardized carrier 150. Alternatively, semiconductor die 124 may have dimensions of 20 mm by 20 mm, which are placed on the same standardized carrier 150. Accordingly, standardized carrier 150 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 150 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

Semiconductor die 124 from FIG. 3d are mounted to carrier 150 and interface layer 152 using, for example, a pick and place operation with active surface 130 and conductive layer 132 oriented toward the carrier. FIG. 4b shows semiconductor die 124 mounted to interface layer 152 of carrier 150 as reconstituted or reconfigured wafer 156.

Reconstituted wafer 156 can be processed into many types of semiconductor packages, including embedded wafer level ball grid array (eWLB), fan-in wafer level chip scale packages (WLCSP), reconstituted or embedded wafer level chip scale packages (eWLCSP), fan-out WLCSP, flipchip packages, three dimensional (3D) packages, package-on-package (PoP), or other semiconductor packages. Reconstituted wafer 156 is configured according to the specifications of the resulting semiconductor package. In one embodiment, semiconductor die 124 are placed on carrier 150 in a high-density arrangement, i.e., 300 micrometers (μm) apart or less, for processing fan-in devices. In another embodiment, semiconductor die 124 are separated by a distance of 50 μm on carrier 150. The distance between semiconductor die 124 on carrier 150 is optimized for manufacturing the semiconductor packages at the lowest unit cost. The larger surface area of carrier 150 accommodates more semiconductor die 124 and lowers manufacturing cost as more semiconductor die 124 are processed per reconstituted wafer 156. The number of semiconductor die 124 mounted to carrier 150 can be greater than the number of semiconductor die 124 singulated from semiconductor wafer 120. Carrier 150 and reconstituted wafer 156 provide the flexibility to manufacture many different types of semiconductor packages using different size semiconductor die 124 from different sized semiconductor wafers 120.

In FIG. 4c, an encapsulant or molding compound 158 is deposited over semiconductor die 124 and carrier 150 as an insulating material using a paste printing, compressive molding, transfer molding, liquid encapsulant molding, vacuum lamination, spin coating, or other suitable applicator. In particular, encapsulant 158 covers the four side surfaces and back surface 128 of semiconductor die 124. Encapsulant 158 can be polymer composite material, such as epoxy resin with filler, epoxy acrylate with filler, or polymer with proper filler. Encapsulant 158 is non-conductive and environmentally protects the semiconductor device from external elements and contaminants. Encapsulant 158 also protects semiconductor die 124 from degradation due to exposure to light.

Figure 4D:
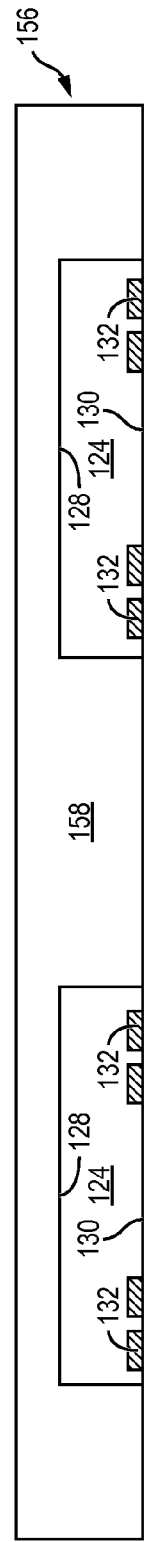

In FIG. 4d, carrier 150 and interface layer 152 are removed by chemical etching, mechanical peeling, chemical mechanical planarization (CMP), mechanical grinding, thermal bake, UV light, laser scanning, or wet stripping to expose active surface 130 and conductive layer 132. Back surface 128 of semiconductor die 124, as well as the sides of the semiconductor die, remain covered by encapsulant 158 as a protective panel to increase yield, particularly when surface mounting the semiconductor die.

Figure 4E:
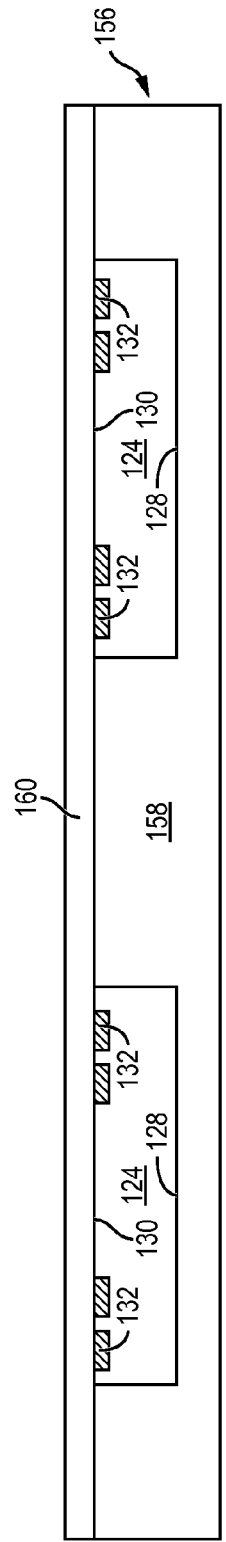

In FIG. 4e, an insulating or passivation layer 160 is formed over semiconductor die 124 and encapsulant 158 using PVD, CVD, printing, lamination, spin coating, or spray coating. The insulating layer 160 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), or other material having similar insulating and structural properties. The insulating layer 160 is infused or implanted with a laser-activated catalyst or particles that become conductive when exposed to infrared (IR) laser radiation. In one embodiment, the laser structurable insulating layer 160 includes a laser-activated catalyst or particles, such as copper-chromium oxide spinel, copper sulfate, copper hydroxide phosphate, or cupric rhodanate, embedded within the insulating layer. The catalyst is converted into an electrically conductive material by laser radiation.

In FIG. 4f, a portion of insulating layer 160 is removed by laser direct ablation (LDA) using IR laser 162 to form vias 163 in the insulating layer to expose conductive layer 132. Laser 162 is controlled in power and wavelength to drill vias 163 through insulating layer 160 while preserving conductive layer 132.

In FIG. 4g, a portion of insulating layer 160 is removed by LDS using IR laser 162 to form channels 164 in the insulating layer. In one embodiment, channels 164 have a line width of 5-25 μm, space width of 5-25 μm, and depth of 5-30 μm. Conductive layer or surface 168 is formed along channels 164 when laser 162 activates the catalyst within insulating layer 160. That is, the laser engraved channels 164 become selectively conductive by formation of conductive layer or surface 168 upon application of IR laser 162.

Figure 4I:
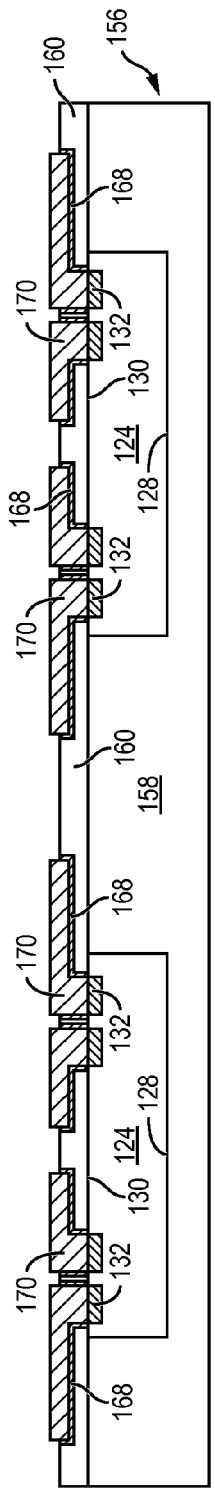

In FIG. 4h, an electrically conductive layer 170 is formed over conductive layer 168 within channels 164 and over conductive layer 132 using a deposition process such as sputtering, electrolytic plating, or electroless plating. Conductive layer 170 can be one or more layers of Al, Cu, Sn, Ni, Au, Ag, or other suitable electrically conductive material. Conductive layer 170 has a thickness of 5-20 μm, and may be recessed below the surface of insulating layer 160, or extend above the surface of the insulating layer, as shown in FIG. 4i. Conductive layers 168 and 170 operate as an RDL formed in part by LDS over semiconductor die 124. RDL 168-170 provides a conductive path extending from conductive layer 132 to other areas above semiconductor die 124 and encapsulant 158 for bump formation and external interconnect. One portion of conductive layer 170 is electrically connected to conductive layer 132. Other portions of conductive layer 170 can be electrically common or electrically isolated depending on the design and function of semiconductor die 124.

Figure 4J:
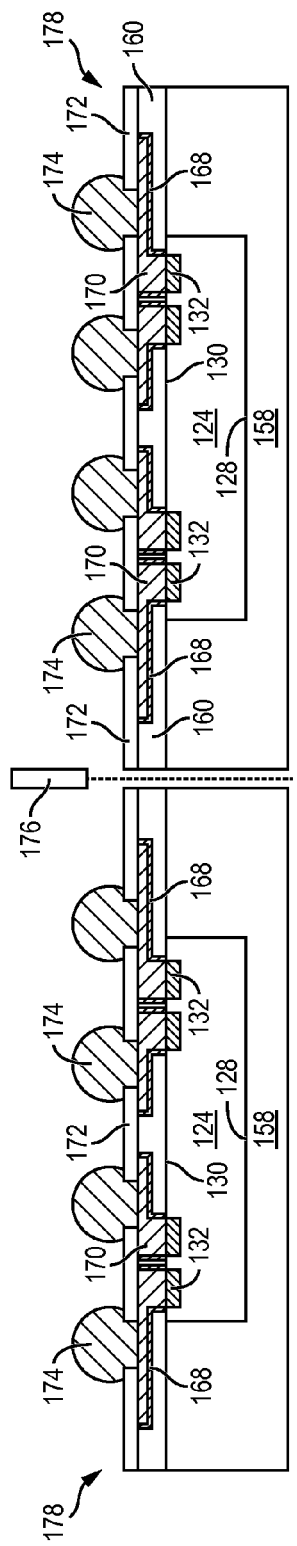

In FIG. 4j, an insulating or passivation layer 172 is formed over insulating layer 160 and conductive layer 170 using PVD, CVD, printing, lamination, spin coating, or spray coating. The insulating layer 172 contains one or more layers of SiO2, Si3N4, SiON, Ta2O5, Al2O3, solder resist, or other material having similar insulating and structural properties. A portion of insulating layer 172 is removed by etching or LDA to expose conductive layer 170.

An electrically conductive bump material is deposited over conductive layer 170 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 170 using a suitable attachment or bonding process. In one embodiment, the bump material is reflowed by heating the material above its melting point to form balls or bumps 174. In some applications, bumps 174 are reflowed a second time to improve electrical contact to conductive layer 170. In one embodiment, bumps 174 are formed over an under bump metallization (UBM) layer. Bumps 174 can also be compression bonded or thermocompression bonded to conductive layer 170. Bumps 174 represent one type of interconnect structure that can be formed over conductive layer 170. The interconnect structure can also use bond wires, conductive paste, stud bump, micro bump, or other electrical interconnect.

Figure 5:
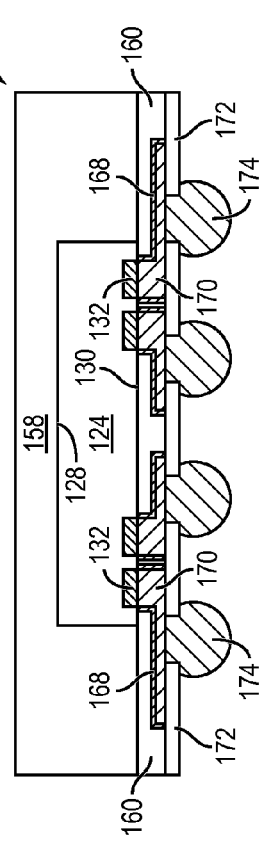
FIG. 5 illustrates the semiconductor die with the RDL formed in accordance with FIGS. 4a-4j.

Semiconductor die 124 are singulated through insulating layers 160 and 172 and encapsulant 158 with saw blade or laser cutting tool 176 into individual eWLB 178. FIG. 5 shows eWLB 178 after singulation. Semiconductor die 124 is electrically connected to RDL 168-170 and bumps 174 for external interconnect. The eWLB 178 may undergo electrical testing before or after singulation. RDL 168-170 is formed in part by LDS over semiconductor die 124. A laser-activated catalyst is infused or implanted within insulating layer 160. Laser 162 forms channels 164 in insulating layer 160 with conductive layer 168 engraved along a surface of the channels by laser radiation of the catalyst in the insulating layer. Conductive layer 170 is formed over conductive layer 168 within channels 164 as the LDS RDL. The LDS RDL 168-170 formation does not involve the extent of repassivation and seed layer sputtering, as described in the background, and requires fewer process steps by eliminating photolithography, mask stripping, and seed layer stripping. The LDS RDL 168-170 achieves finer registration tolerances, finer line and space, process streamlining, lower equipment footprint, and less wet chemical processes, as well as a higher level of alignment compensation and flexibility in pattern adjustments without the masking found in the prior art.

Figure 6A:
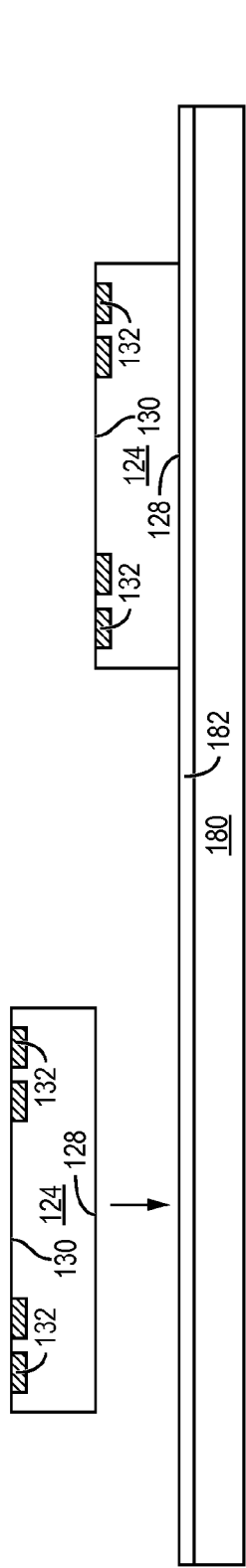

FIGS. 6a-6i illustrate, in relation to FIG. 1, another process of forming an RDL and vertical interconnect in an encapsulant by LDS over semiconductor die 124. FIG. 6a shows a cross-sectional view of a portion of a carrier or temporary substrate 180 containing sacrificial base material such as silicon, polymer, beryllium oxide, glass, or other suitable low-cost, rigid material for structural support. An interface layer or double-sided tape 182 is formed over carrier 180 as a temporary adhesive bonding film, etch-stop layer, or thermal release layer.

Figure 6B:
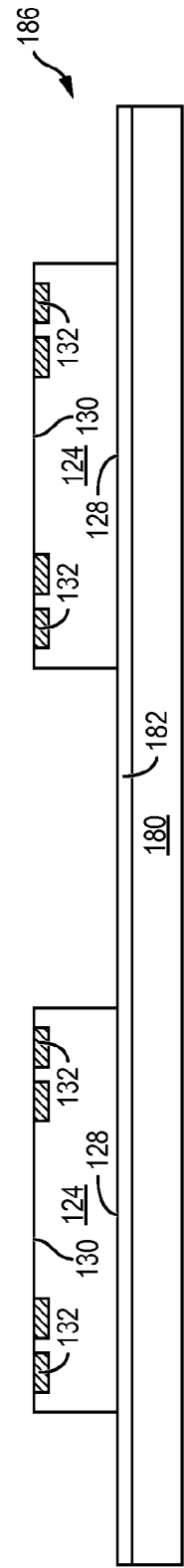

Semiconductor die 124 from FIG. 3d are mounted to carrier 180 and interface layer 182 using, for example, a pick and place operation with back surface 128 oriented toward the carrier. FIG. 6b shows semiconductor die 124 mounted to interface layer 182 of carrier 180 as reconstituted or reconfigured wafer 186.

Reconstituted wafer 186 can be processed into many types of semiconductor packages, including eWLB, fan-in WLCSP, eWLCSP, fan-out WLCSP, flipchip packages, 3D packages, PoP, or other semiconductor packages. Reconstituted wafer 186 is configured according to the specifications of the resulting semiconductor package. In one embodiment, semiconductor die 124 are placed on carrier 180 in a high-density arrangement, i.e., 300 μm apart or less, for processing fan-in devices. In another embodiment, semiconductor die 124 are separated by a distance of 50 μm on carrier 180. The distance between semiconductor die 124 on carrier 180 is optimized for manufacturing the semiconductor packages at the lowest unit cost. The larger surface area of carrier 180 accommodates more semiconductor die 124 and lowers manufacturing cost as more semiconductor die 124 are processed per reconstituted wafer 186. The number of semiconductor die 124 mounted to carrier 180 can be greater than the number of semiconductor die 124 singulated from semiconductor wafer 120. Carrier 180 and reconstituted wafer 186 provide the flexibility to manufacture many different types of semiconductor packages using different size semiconductor die 124 from different sized semiconductor wafers 120.

Figure 6C:
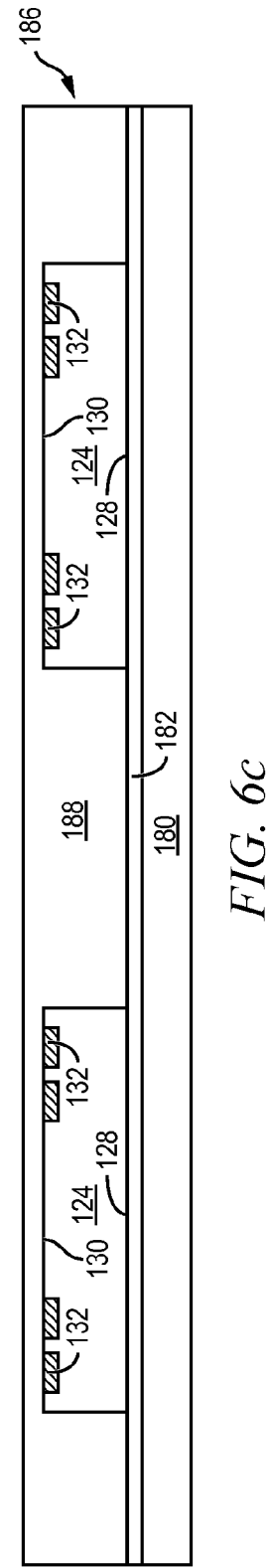

In FIG. 6c, an encapsulant or molding compound 188 is deposited over semiconductor die 124 and carrier 180 as an insulating material using a paste printing, compressive molding, transfer molding, liquid encapsulant molding, vacuum lamination, spin coating, or other suitable applicator. In particular, encapsulant 188 covers the four side surfaces and active surface 130 of semiconductor die 124. Encapsulant 188 can be polymer composite material, such as epoxy resin with filler, epoxy acrylate with filler, or polymer with proper filler. Encapsulant 188 is non-conductive and environmentally protects the semiconductor device from external elements and contaminants. Encapsulant 188 also protects semiconductor die 124 from degradation due to exposure to light.

Encapsulant 188 is infused or implanted with a laser-activated catalyst or particles that become conductive when exposed to IR laser radiation. In one embodiment, the laser structurable encapsulant 188 includes a laser-activated catalyst or particles embedded within the encapsulant. The catalyst is converted into an electrically conductive material by laser radiation.

Figure 6D:
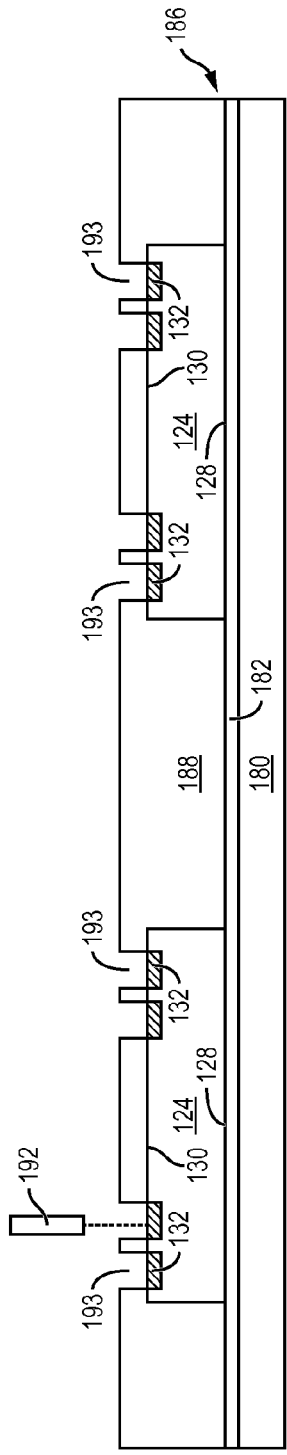

In FIG. 6d, a portion of encapsulant 188 is removed by LDA using IR laser 192 to form vias 193 in the encapsulant to expose conductive layer 132. Laser 192 is controlled in power and wavelength to drill vias 193 through encapsulant 188 while preserving conductive layer 132.

Figure 6E:
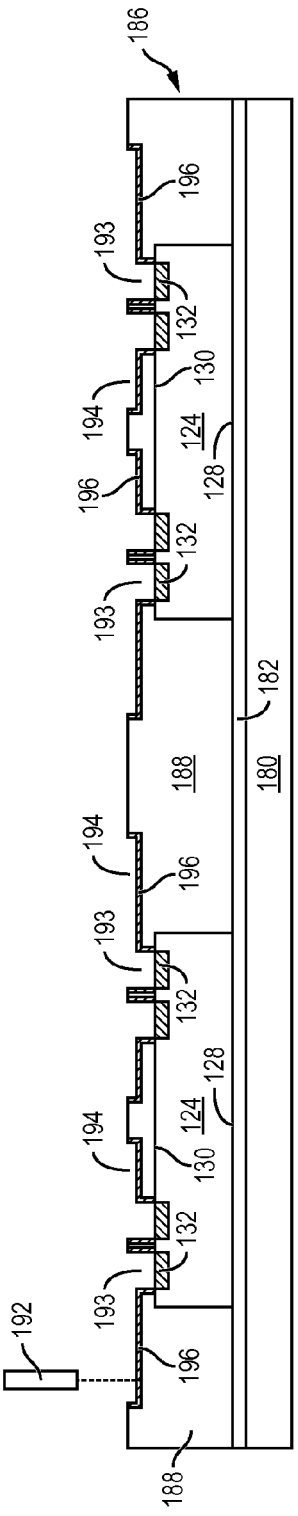

In FIG. 6e, a portion of encapsulant 188 is removed by LDS using IR laser 192 to form channels 194 in the encapsulant. In one embodiment, channels 194 have a line width of 5-25 μm, space width of 5-25 μm, and depth of 5-30 μm. Conductive layer or surface 196 is formed along channels 194 when laser 192 activates the catalyst within encapsulant 188. That is, the laser engraved channels 194 become selectively conductive by formation of conductive layer or surface 196 upon application of IR laser 192.

Figure 6F:
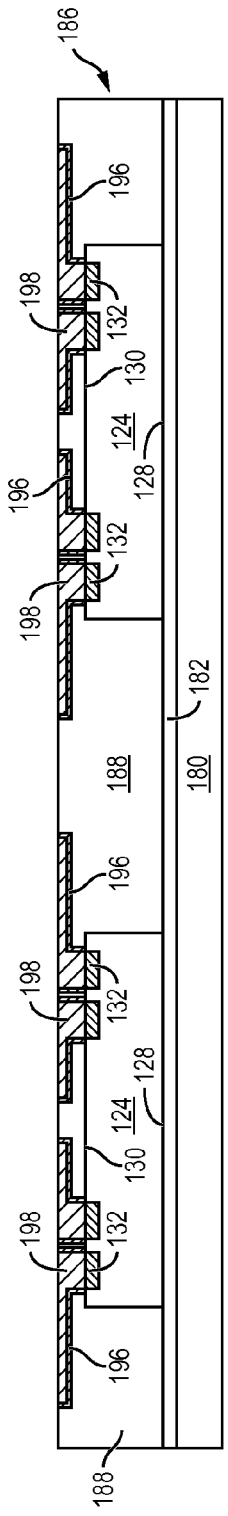

In FIG. 6f, an electrically conductive layer 198 is formed over conductive layer 196 within channels 194 and over conductive layer 132 using a deposition process such as sputtering, electrolytic plating, or electroless plating. Conductive layer 198 can be one or more layers of Al, Cu, Sn, Ni, Au, Ag, or other suitable electrically conductive material. Conductive layer 198 has a thickness of 5-20 μm, and may be recessed below the surface of encapsulant 188, or extend above the surface of the encapsulant. Conductive layers 196 and 198 operate as an RDL formed in part by LDS over semiconductor die 124. RDL 196-198 provides a conductive path extending from conductive layer 132 to other areas above semiconductor die 124 and encapsulant 188 for bump formation and external interconnect. One portion of conductive layer 198 is electrically connected to conductive layer 132. Other portions of conductive layer 198 can be electrically common or electrically isolated depending on the design and function of semiconductor die 124.

In FIG. 6g, an insulating or passivation layer 200 is formed over encapsulant 188 and conductive layer 198 using PVD, CVD, printing, lamination, spin coating, or spray coating. The insulating layer 200 contains one or more layers of SiO2, Si3N4, SiON, Ta2O5, Al2O3, solder resist, or other material having similar insulating and structural properties. A portion of insulating layer 200 is removed by etching or LDA to expose conductive layer 198.

An electrically conductive bump material is deposited over conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form balls or bumps 202. In some applications, bumps 202 are reflowed a second time to improve electrical contact to conductive layer 198. In one embodiment, bumps 202 are formed over a UBM layer. Bumps 202 can also be compression bonded or thermocompression bonded to conductive layer 198. Bumps 202 represent one type of interconnect structure that can be formed over conductive layer 198. The interconnect structure can also use bond wires, conductive paste, stud bump, micro bump, or other electrical interconnect.

In FIG. 6h, carrier 180 and interface layer 182 are removed by chemical etching, mechanical peeling, CMP, mechanical grinding, thermal bake, UV light, laser scanning, or wet stripping to expose back surface 128. Active surface 130 of semiconductor die 124, as well as the sides of the semiconductor die, remain covered by encapsulant 188 as a protective panel to increase yield, particularly when surface mounting the semiconductor die.

FIG. 6i shows an optional protection layer 204 formed over encapsulant 188 and back surface 128 of semiconductor die 124. Semiconductor die 124 are singulated through encapsulant 188, insulating layer 200, and protective layer 204 with saw blade or laser cutting tool 206 into individual eWLB 208.

Figure 7:
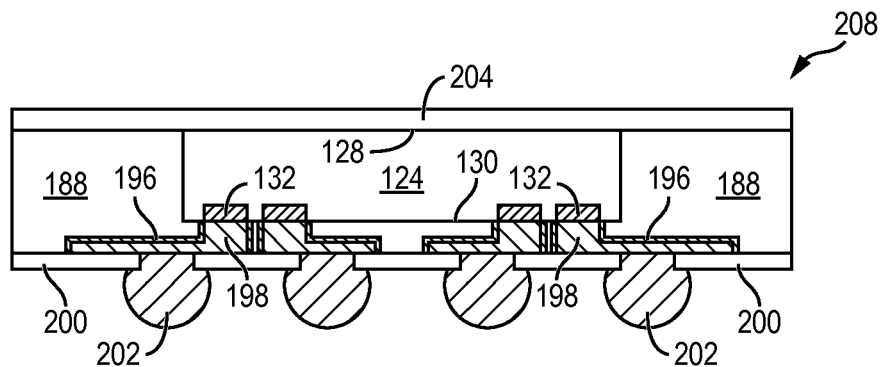
FIG. 7 illustrates the semiconductor die with the RDL formed in accordance with FIGS. 6a-6i.

FIG. 7 shows eWLB 208 after singulation. Semiconductor die 124 is electrically connected to RDL 196-198 and bumps 202 for external interconnect. The eWLB 208 may undergo electrical testing before or after singulation. RDL 196-198 is formed in part by LDS over semiconductor die 124. A laser-activated catalyst is infused or implanted within encapsulant 188. Laser 192 forms channels 194 in encapsulant 188 with conductive layer 196 engraved along a surface of the channels by laser radiation of the catalyst in the encapsulant. Conductive layer 198 is formed over conductive layer 196 within channels 194 as the LDS RDL. The LDS RDL 196-198 formation does not involve the extent of repassivation and seed layer sputtering, as described in the background, and requires fewer process steps by eliminating photolithography, mask stripping, and seed layer stripping. The LDS RDL 196-198 achieves finer registration tolerances, finer line and space, process streamlining, lower equipment footprint, and less wet chemical processes, as well as a higher level of alignment compensation and flexibility in pattern adjustments without the masking found in the prior art.

Figure 8:
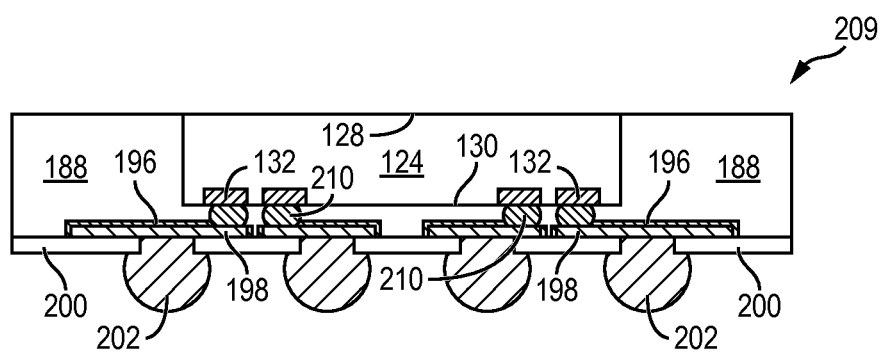
FIG. 8 illustrates a semiconductor die with bumps and RDL formed in the encapsulant by LDS.

FIG. 8 shows an embodiment of eWLB 209, similar to FIGS. 6a-6h, with bumps 210 formed between conductive layer 132 and RDL 196-198. In one embodiment, bumps 210 are formed over conductive layer 132 in wafer form, see FIG. 3c. Semiconductor die 124 is electrically connected to RDL 196-198 and bumps 202 and 210 for external interconnect.

Figure 9A:
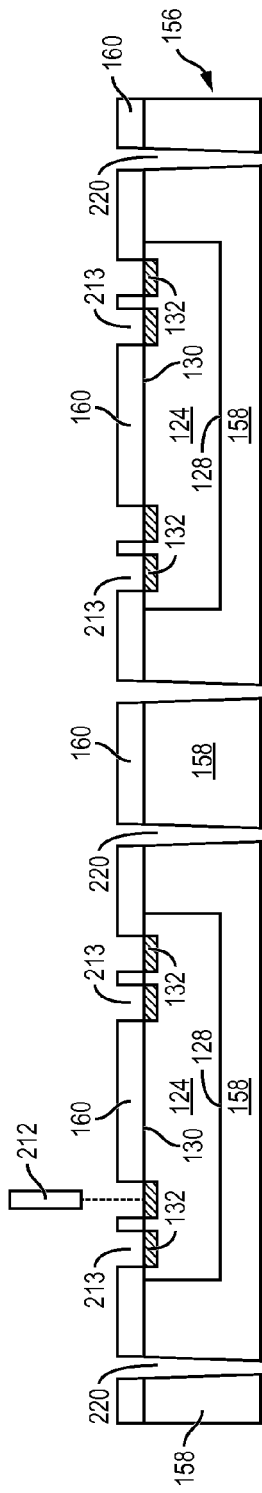

FIGS. 9a-9e illustrate, in relation to FIG. 1, another process of forming an RDL and vertical interconnect in an insulating layer and encapsulant by LDS over semiconductor die 124. Continuing from FIG. 4e, a portion of insulating layer 160 is removed by LDA using IR laser 212 to form vias 213 in the insulating layer to expose conductive layer 132, as shown in FIG. 9a. Laser 212 is controlled in power and wavelength to drill vias 213 through insulating layer 160 while preserving conductive layer 132. Laser 212 also forms vias 220 completely through encapsulant 158 and insulating layer 160.

Figure 9B:
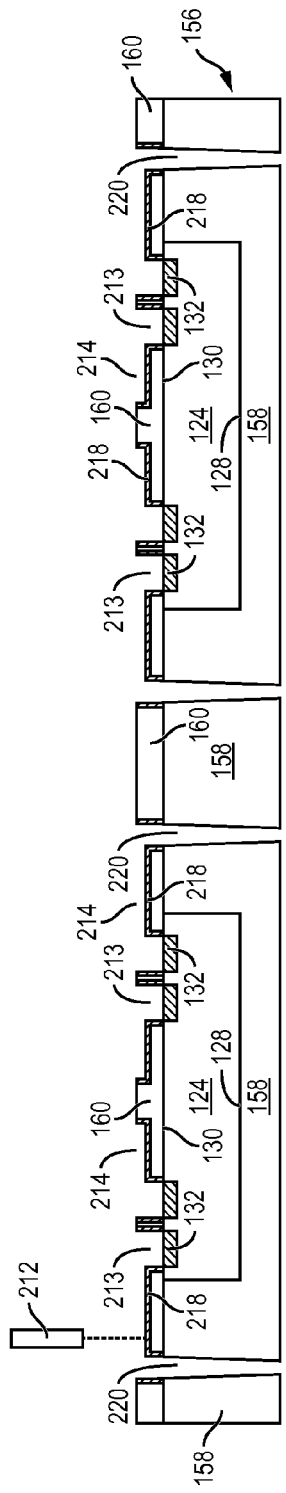

In FIG. 9b, a portion of insulating layer 160 is removed by LDS using IR laser 212 to form channels 214 in the insulating layer. In one embodiment, channels 214 have a line width of 5-25 μm, space width of 5-25 μm, and depth of 5-30 μm. Conductive layer or surface 218 is formed along channels 214 when laser 212 activates the catalyst within insulating layer 160. That is, the laser engraved channels 214 become selectively conductive by formation of conductive layer or surface 218 upon application of IR laser 212.

Figure 9C:
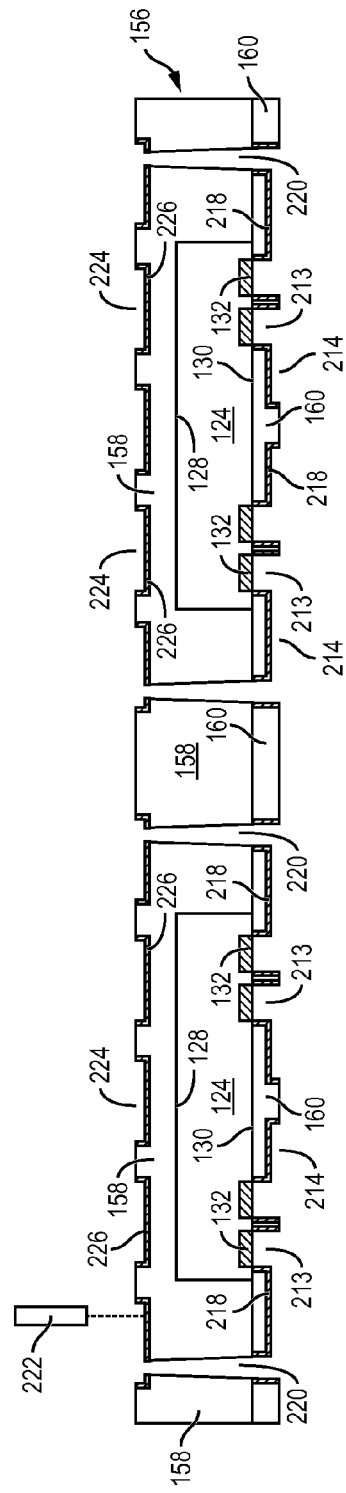

In FIG. 9c, reconstituted wafer 156 is inverted and a portion of encapsulant 158 is removed by LDS using IR laser 222 to form channels 224 in the encapsulant. In one embodiment, channels 224 have a line width of 5-25 μm, space width of 5-25 μm, and depth of 5-30 μm. Encapsulant 158 is infused or implanted with a laser-activated catalyst or particles that become conductive when exposed to IR laser radiation. In one embodiment, the laser structurable encapsulant 158 includes a laser-activated catalyst or particles embedded within the encapsulant. The catalyst is converted into an electrically conductive material by laser irradiation. Accordingly, conductive layer 226 is formed along a surface of channels 224 when laser 222 activates the catalyst within encapsulant 158. The laser engraved channels 224 become selectively conductive by formation of conductive layer or surface 226 upon application of IR laser 222. The removal of encapsulant 158 by laser 222 extends to vias 220 to open a path from channels 214 to channels 224.

In FIG. 9d, conductive material is deposited in the vias through encapsulant 158 to form conductive vias or vertical interconnect 231. An electrically conductive layer 230 is formed over conductive layer 218 within channels 214 and over conductive layer 132 using a deposition process such as sputtering, electrolytic plating, or electroless plating. An electrically conductive layer 232 is formed over conductive layer 226 within channels 224. Conductive layers 230-232 can be one or more layers of Al, Cu, Sn, Ni, Au, Ag, or other suitable electrically conductive material. Conductive layer 230 has a thickness of 5-20 µm, and may be recessed below the surface of insulating layer 160, or extend above the surface of the insulating layer. Likewise, conductive layer 232 has a thickness of 5-20 µm, and may be recessed below the surface of encapsulant 158, or extend above the surface of the encapsulant. Conductive layers 218, 230 and 226, 232 operate as an RDL formed in part by LDS over semiconductor die 124. RDL 218, 230 and RDL 226, 232 provide a conductive path to areas above semiconductor die 124 and encapsulant 158 for bump formation and external interconnect. Conductive layer 230 is electrically connected through conductive vias 231 to conductive layer 232. One portion of conductive layer 230 is electrically connected to conductive layer 132. Other portions of conductive layers 230 and 232 can be electrically common or electrically isolated depending on the design and function of semiconductor die 124.

In FIG. 9e, reconstituted wafer 156 is again inverted and an insulating or passivation layer 234 is formed over insulating layer 160 and conductive layer 230 using PVD, CVD, printing, lamination, spin coating, or spray coating. The insulating layer 234 contains one or more layers of SiO2, Si3N4, SiON, Ta2O5, Al2O3, solder resist, or other material having similar insulating and structural properties. A portion of insulating layer 234 is removed by etching or LDA to expose conductive layer 230 for vertical interconnect.

An insulating or passivation layer 236 is formed over encapsulant 158 and conductive layer 232 using PVD, CVD, printing, lamination, spin coating, or spray coating. The insulating layer 236 contains one or more layers of SiO2, Si3N4, SiON, Ta2O5, Al2O3, solder resist, or other material having similar insulating and structural properties. A portion of insulating layer 236 is removed by etching or LDA to expose conductive layer 232.

An electrically conductive bump material is deposited over conductive layer 232 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 232 using a suitable attachment or bonding process. In one embodiment, the bump material is reflowed by heating the material above its melting point to form balls or bumps 238. In some applications, bumps 238 are reflowed a second time to improve electrical contact to conductive layer 232. In one embodiment, bumps 238 are formed over a UBM layer. Bumps 238 can also be compression bonded or thermocompression bonded to conductive layer 232. Bumps 238 represent one type of interconnect structure that can be formed over conductive layer 232. The interconnect structure can also use bond wires, conductive paste, stud bump, micro bump, or other electrical interconnect.

Figure 10:
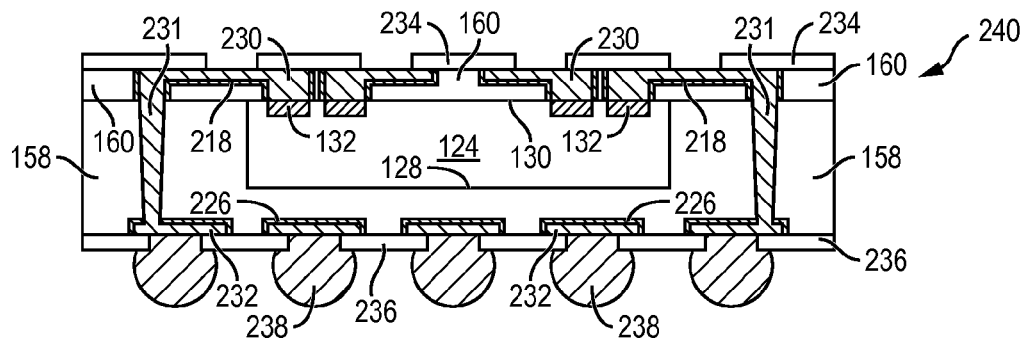
FIG. 10 illustrates the semiconductor die with the RDL and vertical interconnect formed in accordance with FIGS. 9a-9e.

Semiconductor die 124 are singulated through insulating layers 160, 234, and 236 and encapsulant 158 with saw blade or laser cutting tool 239 into individual eWLB 240. FIG. 10 shows eWLB 240 after singulation. Semiconductor die 124 is oriented with back surface 128 toward bumps 238. Semiconductor die 124 is electrically connected to RDL 218, 230, RDL 226, 232, and bumps 238 for external interconnect. The eWLB 240 may undergo electrical testing before or after singulation. RDL 218, 230 and RDL 226, 232 are formed in part by LDS over semiconductor die 124. A laser-activated catalyst is infused or implanted within insulating layer 160 and encapsulant 158. Laser 212 forms channels 214 in insulating layer 160 with conductive layer 218 engraved along a surface of the channels by laser radiation of the catalyst in the insulating layer. Conductive layer 230 is formed over conductive layer 218 within channels 214 as the LDS RDL 218, 230. Laser 222 forms channels 224 in encapsulant 158 with conductive layer 226 engraved along a surface of the channels by laser radiation of the catalyst in the encapsulant. Conductive layer 232 is formed over conductive layer 226 within channels 224 as the LDS RDL 226, 232. Conductive vias 231 electrically connect RDL 218, 230 and RDL 226, 232. The LDS RDL formation does not involve the extent of repassivation and seed layer sputtering, as described in the background, and requires fewer process steps by eliminating photolithography, mask stripping, and seed layer stripping. The LDS RDLs achieve finer registration tolerances, finer line and space, process streamlining, lower equipment footprint, and less wet chemical processes, as well as a higher level of alignment compensation and flexibility in pattern adjustments without the masking found in the prior art.

Figure 11:
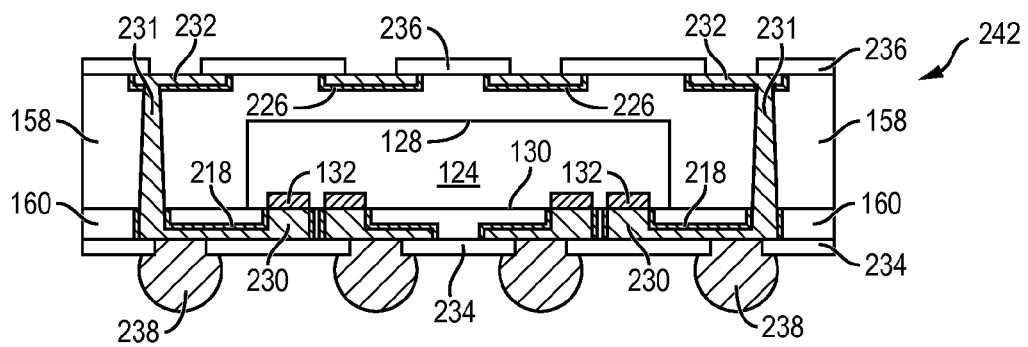
FIG. 11 illustrates a semiconductor die with an RDL and vertical interconnect formed in the encapsulant by LDS.

FIG. 11 shows an embodiment of eWLB 242, similar to FIGS. 9a-9e, with semiconductor die 124 oriented active surface 130 toward bumps 238. Semiconductor die 124 is electrically connected to RDL 218, 230, RDL 226, 232, and bumps 238 for external interconnect.

Figure 12:
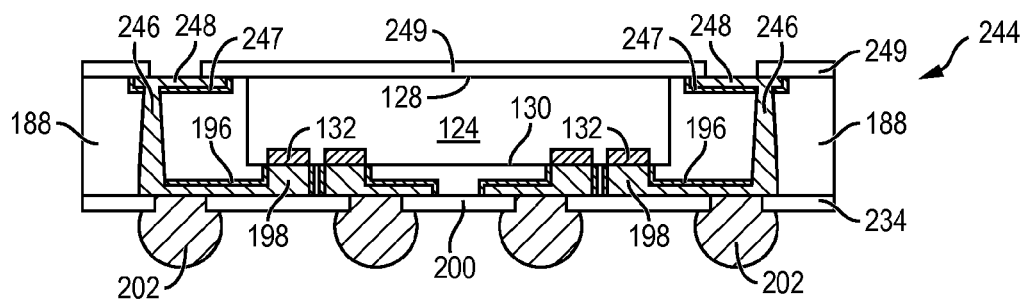
FIG. 12 illustrates another semiconductor die with an RDL and vertical interconnect formed in the encapsulant by LDS.

FIG. 12 shows an embodiment of eWLB 244, similar to FIGS. 6a-6h, with semiconductor die 124 oriented active surface 130 toward bumps 202. Encapsulant 188 and RDL 196-198 are formed as described in FIGS. 6a-6h. Vias are formed completely through encapsulant 188 and filled with conductive material to form conductive vias 246. A portion of encapsulant 188 is removed by LDS to form channels in the encapsulant. Conductive layer 247 is formed along a surface of the channels when the laser activates the catalyst within encapsulant 188. An electrically conductive layer 248 is formed over conductive layer 247 within the channels using a deposition process such as sputtering, electrolytic plating, or electroless plating. Conductive layer 248 can be one or more layers of Al, Cu, Sn, Ni, Au, Ag, or other suitable electrically conductive material. Conductive layers 198, 248 have a thickness of 5-20 µm, and may be recessed below the surface of encapsulant 188, or extend above the surface of the encapsulant. Conductive layers 196, 198 and 247, 248 operate as an RDL formed in part by LDS over semiconductor die 124. RDL 196-198 and RDL 247-248 provide a conductive path to areas above semiconductor die 124 and encapsulant 188 for bump formation and external interconnect. Conductive layer 248 is electrically connected through conductive vias 246 to conductive layer 198.

An insulating or passivation layer 249 is formed over back surface 128 of semiconductor die 124, encapsulant 188, and conductive layer 248 using PVD, CVD, printing, lamination, spin coating, or spray coating. The insulating layer 249 contains one or more layers of SiO2, Si3N4, SiON, Ta2O5, Al2O3, solder resist, or other material having similar insulating and structural properties. A portion of insulating layer 249 is removed by etching or LDA to expose conductive layer 248 for vertical interconnect. Semiconductor die 124 is electrically connected to RDL 196-198, RDL 247-248, and bumps 202 for external interconnect.

Figure 13:
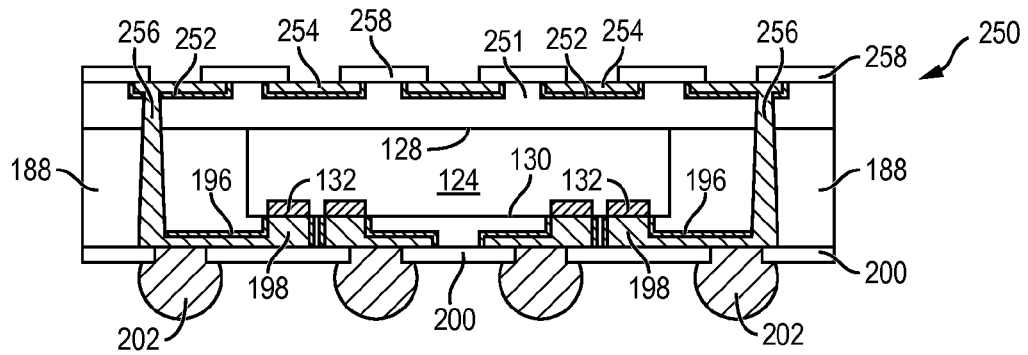
FIG. 13 illustrates a semiconductor die with an RDL and vertical interconnect formed in an insulating layer and encapsulant by LDS.

FIG. 13 shows an embodiment of eWLB 250, similar to FIGS. 6a-6h, with semiconductor die 124 oriented active surface 130 toward bumps 238. An insulating layer 251 is formed over encapsulant 188 and back surface 128 of semiconductor die 124. The insulating layer 251 contains one or more layers of SiO2, Si3N4, SiON, Ta2O5, Al2O3, or other material having similar insulating and structural properties. The insulating layer 251 is infused or implanted with a laser-activated catalyst or particles that become conductive when exposed to IR laser radiation. In one embodiment, the laser structurable insulating layer 251 includes a laser-activated catalyst or particles embedded within the encapsulant. The catalyst is converted into an electrically conductive material by laser radiation.

A portion of insulating layer 251 is removed by LDS to form channels in the insulating layer. Conductive layer or surface 252 is formed along the channels when the laser activates the catalyst within insulating layer 251. That is, the laser engraved channels become selectively conductive by formation of conductive layer or surface 252 upon application of the IR laser. Vias are formed completely through encapsulant 188 and insulating layer 251 and filled with conductive material to form conductive vias 256.

An electrically conductive layer 254 is formed over conductive layer 252 within the channels in insulating layer 251 using a deposition process such as sputtering, electrolytic plating, or electroless plating. Conductive layer 254 can be one or more layers of Al, Cu, Sn, Ni, Au, Ag, or other suitable electrically conductive material. Conductive layer 198 has a thickness of 5-20 μm, and may be recessed below the surface of encapsulant 188, or extend above the surface of the encapsulant. Likewise, conductive layer 254 has a thickness of 5-20 μm, and may be recessed below the surface of insulating layer 251, or extend above the surface of the insulating layer. Conductive layers 252 and 254 operate as an RDL formed in part by LDS over semiconductor die 124. RDL 252-254 provides a conductive path to areas above semiconductor die 124 and encapsulant 188 for external interconnect. One portion of conductive layer 254 is electrically connected to conductive vias 256. Other portions of conductive layer 254 can be electrically common or electrically isolated depending on the design and function of semiconductor die 124.

An insulating or passivation layer 258 is formed over insulating layer 251 and conductive layer 254 using PVD, CVD, printing, lamination, spin coating, or spray coating. The insulating layer 258 contains one or more layers of SiO2, Si3N4, SiON, Ta2O5, Al2O3, solder resist, or other material having similar insulating and structural properties. A portion of insulating layer 258 is removed by etching or LDA to expose conductive layer 254. Semiconductor die 124 is electrically connected to RDL 196-198, RDL 252-254, and bumps 202 for external interconnect.

Figure 14D:
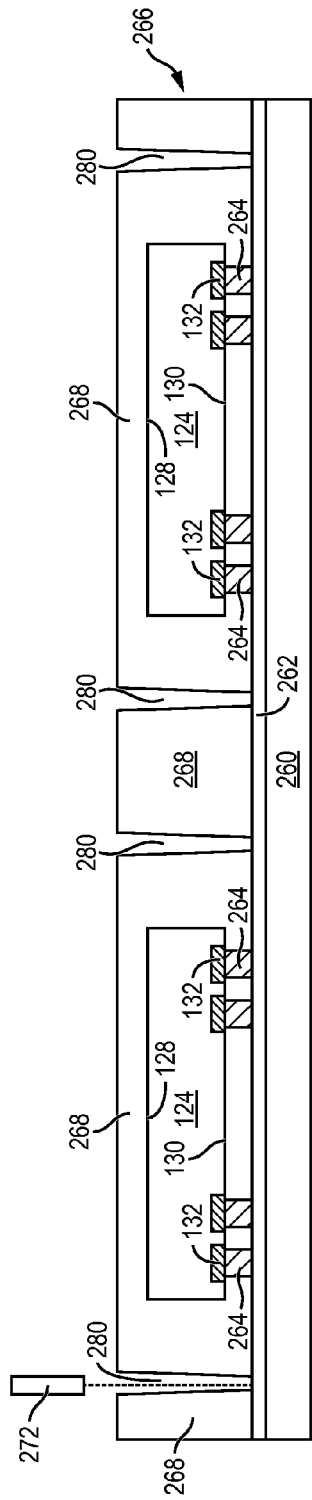

FIGS. 14*a*-14*i* illustrate, in relation to FIG. 1, another process of forming an RDL and vertical interconnect in an encapsulant by LDS over semiconductor die 124. FIG. 14*a* shows a cross-sectional view of a portion of a carrier or temporary substrate 260 containing sacrificial base material such as silicon, polymer, beryllium oxide, glass, or other suitable low-cost, rigid material for structural support. An interface layer or double-sided tape 262 is formed over carrier 260 as a temporary adhesive bonding film, etch-stop layer, or thermal release layer.

Carrier 260 can be a round or rectangular panel (greater than 300 mm) with capacity for multiple semiconductor die 124. Carrier 260 may have a larger surface area than the surface area of semiconductor wafer 120. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 260 is selected independent of the size of semiconductor die 124 or size of semiconductor wafer 120. That is, carrier 260 has a fixed or standardized size, which can accommodate various size semiconductor die 124 singulated from one or more semiconductor wafers 120. In one embodiment, carrier 260 is circular with a diameter of 330 mm. In another embodiment, carrier 260 is rectangular with a width of 560 mm and length of 600 mm. Semiconductor die 124 may have dimensions of 10 mm by 10 mm, which are placed on the standardized carrier 260. Alternatively, semiconductor die 124 may have dimensions of 20 mm by 20 mm, which are placed on the same standardized carrier 260. Accordingly, standardized carrier 260 can handle any size semiconductor die 124, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 260 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

In FIG. 14*a*, conductive bumps or pillars 264 are formed over conductive layer 132 of semiconductor die 124, typically while still in wafer form, see FIG. 3*c*. Semiconductor die 124, with conductive bumps or pillars 264 formed over conductive layer 132, are mounted to carrier 260 and interface layer 262 using, for example, a pick and place operation with conductive pillars 264 and active surface 130 oriented toward the carrier. FIG. 14*b* shows semiconductor die 124 mounted to interface layer 262 of carrier 260 as reconstituted or reconfigured wafer 266.

Reconstituted wafer 266 can be processed into many types of semiconductor packages, including eWLB, fan-in WLCSP, eWLCSP, fan-out WLCSP, flipchip packages, 3D packages, PoP, or other semiconductor packages. Reconstituted wafer 266 is configured according to the specifications of the resulting semiconductor package. In one embodiment, semiconductor die 124 are placed on carrier 260 in a high-density arrangement, i.e., 300 μm apart or less, for processing fan-in devices. In another embodiment, semiconductor die 124 are separated by a distance of 50 μm on carrier 260. The distance between semiconductor die 124 on carrier 260 is optimized for manufacturing the semiconductor packages at the lowest unit cost. The larger surface area of carrier 260 accommodates more semiconductor die 124 and lowers manufacturing cost as more semiconductor die 124 are processed per reconstituted wafer 266. The number of semiconductor die 124 mounted to carrier 260 can be greater than the number of semiconductor die 124 singulated from semiconductor wafer 120. Carrier 260 and reconstituted wafer 266 provide the flexibility to manufacture many different types of semiconductor packages using different size semiconductor die 124 from different sized semiconductor wafers 120.

In FIG. 14*c*, an encapsulant or molding compound 268 is deposited over semiconductor die 124 and carrier 260 as an insulating material using a paste printing, compressive molding, transfer molding, liquid encapsulant molding, vacuum lamination, spin coating, or other suitable applicator. In particular, encapsulant 268 covers the four side surfaces and back surface 128 of semiconductor die 124. Encapsulant 268 can be polymer composite material, such as epoxy resin with filler, epoxy acrylate with filler, or polymer with proper filler. Encapsulant 268 is non-conductive and environmentally protects the semiconductor device from external elements and contaminants. Encapsulant 268 also protects semiconductor die 124 from degradation due to exposure to light.

Encapsulant 268 is infused or implanted with a laser-activated catalyst or particles that become conductive when exposed to IR laser radiation. In one embodiment, the laser structurable encapsulant 268 includes a laser-activated catalyst or particles embedded within the encapsulant. The catalyst is converted into an electrically conductive material by laser radiation.

Figure 14E:
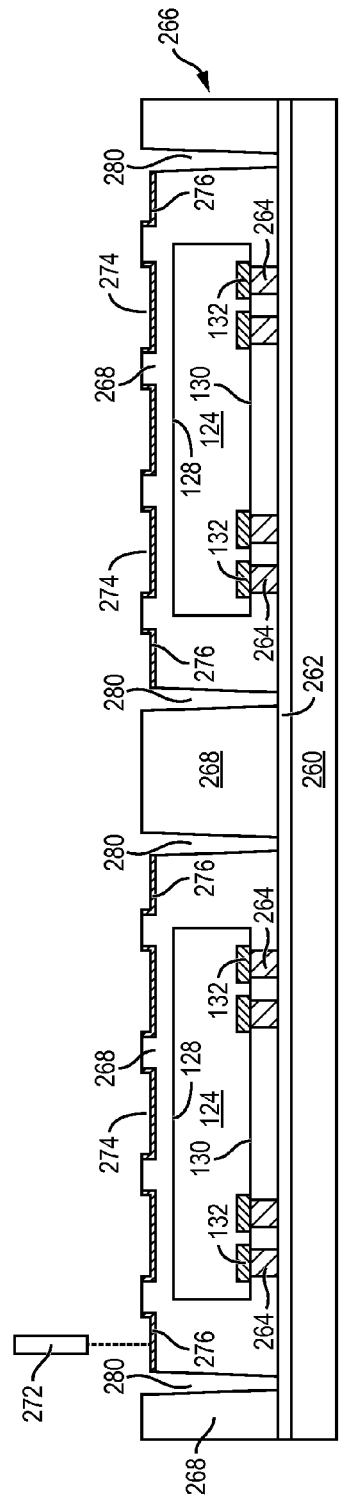

In FIG. 14d, a portion of encapsulant 268 is removed by LDA using laser 272 to form vias 280 completely through the encapsulant. In FIG. 14e, a portion of encapsulant 268 is removed by LDS using IR laser 272 to form channels 274 in the encapsulant. In one embodiment, channels 274 have a line width of 5-25 μm, space width of 5-25 μm, and depth of 5-30 μm. Conductive layer or surface 276 is formed along channels 274 when laser 272 activates the catalyst within encapsulant 268. That is, the laser engraved channels 274 become selectively conductive by formation of conductive layer or surface 276 upon application of IR laser 272.

Figure 14F:
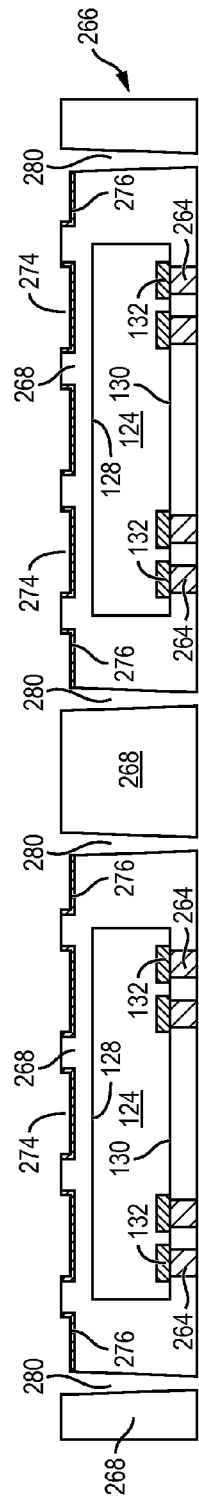

In FIG. 14f, carrier 260 and interface layer 262 are removed by chemical etching, mechanical peeling, CMP, mechanical grinding, thermal bake, UV light, laser scanning, or wet stripping to expose conductive pillars 264. Back surface 128 and active surface 130 of semiconductor die 124, as well as the sides of the semiconductor die, remain covered by encapsulant 268 as a protective panel to increase yield, particularly when surface mounting the semiconductor die.

Figure 14G:
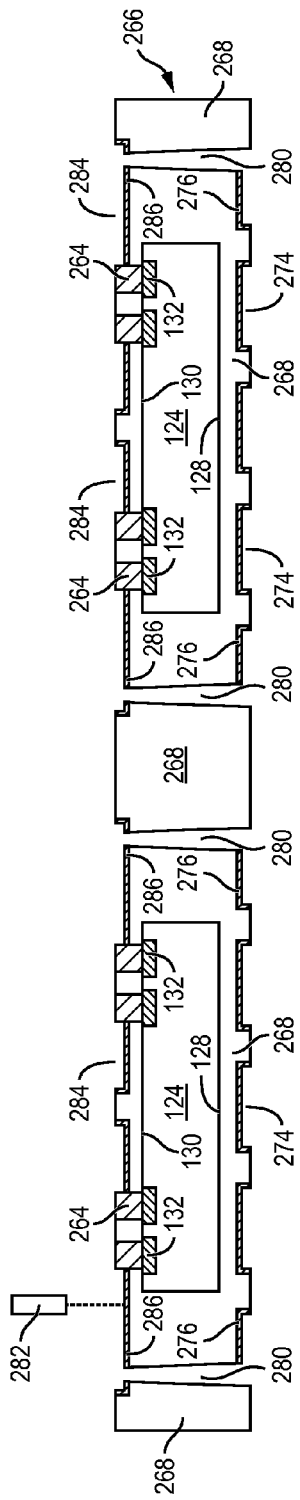

In FIG. 14g, reconstituted wafer 266 is inverted and a portion of encapsulant 268 is removed by LDS using IR laser 282 to form channels 284 in the encapsulant. In one embodiment, channels 284 have a line width of 5-25 μm, space width of 5-25 μm, and depth of 5-30 μm. Conductive layer 286 is formed along a surface of channels 284 when laser 282 activates the catalyst within encapsulant 268. The laser engraved channels 284 become selectively conductive by formation of conductive layer or surface 286 upon application of IR laser 282. The removal of encapsulant 268 by laser 282 extends to vias 280 to open a path from channels 274 to channels 284.

Figure 14H:
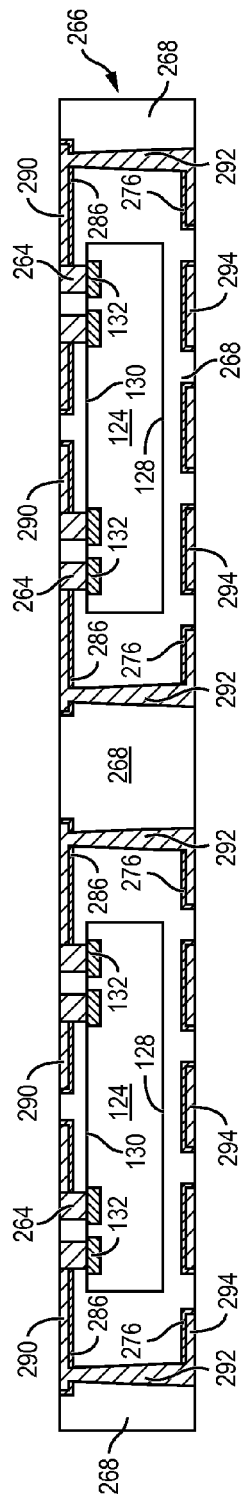

In FIG. 14h, an electrically conductive layer is formed in vias 280 as conductive vias or vertical interconnect 292. An electrically conductive layer 290 is formed over conductive layer 286 within channels 284 using a deposition process such as sputtering, electrolytic plating, or electroless plating. An electrically conductive layer 294 is formed over conductive layer 276 within channels 274. Conductive layers 290-294 can be one or more layers of Al, Cu, Sn, Ni, Au, Ag, or other suitable electrically conductive material. Conductive layers 264, 294 have a thickness of 5-20 μm, and may be recessed below the surface of encapsulant 268, or extend above the surface of the encapsulant. Conductive layers 286, 290 operate as an RDL formed in part by LDS over semiconductor die 124. Likewise, conductive layers 276, 294 operate as an RDL formed in part by LDS over semiconductor die 124. RDL 276, 294 and RDL 276, 294 provide a conductive path to areas above semiconductor die 124 and encapsulant 268 for bump formation and external interconnect. Conductive layer 290 is electrically connected through conductive vias 292 to conductive layer 294. One portion of conductive layer 290 is electrically connected to conductive pillars 264. Other portions of conductive layers 290 and 294 can be electrically common or electrically isolated depending on the design and function of semiconductor die 124.

Figure 14I:
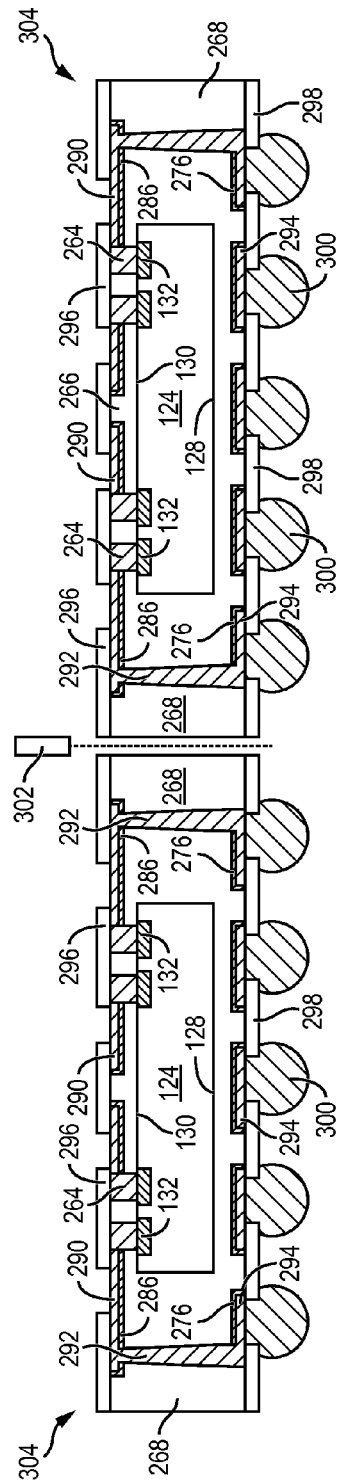

In FIG. 14i, an insulating or passivation layer 296 is formed over encapsulant 268 and conductive layer 290 using PVD, CVD, printing, lamination, spin coating, or spray coating. The insulating layer 296 contains one or more layers of SiO2, Si3N4, SiON, Ta2O5, Al2O3, solder resist, or other material having similar insulating and structural properties. A portion of insulating layer 296 is removed by etching or LDA to expose conductive layer 290 for vertical interconnect.

An insulating or passivation layer 298 is formed over encapsulant 268 and conductive layer 294 using PVD, CVD, printing, lamination, spin coating, or spray coating. The insulating layer 298 contains one or more layers of SiO2, Si3N4, SiON, Ta2O5, Al2O3, solder resist, or other material having similar insulating and structural properties. A portion of insulating layer 298 is removed by etching or LDA to expose conductive layer 294.

An electrically conductive bump material is deposited over conductive layer 294 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 294 using a suitable attachment or bonding process. In one embodiment, the bump material is reflowed by heating the material above its melting point to form balls or bumps 300. In some applications, bumps 300 are reflowed a second time to improve electrical contact to conductive layer 294. In one embodiment, bumps 300 are formed over a UBM layer. Bumps 300 can also be compression bonded or thermocompression bonded to conductive layer 294. Bumps 300 represent one type of interconnect structure that can be formed over conductive layer 294. The interconnect structure can also use bond wires, conductive paste, stud bump, micro bump, or other electrical interconnect.

Figure 15:
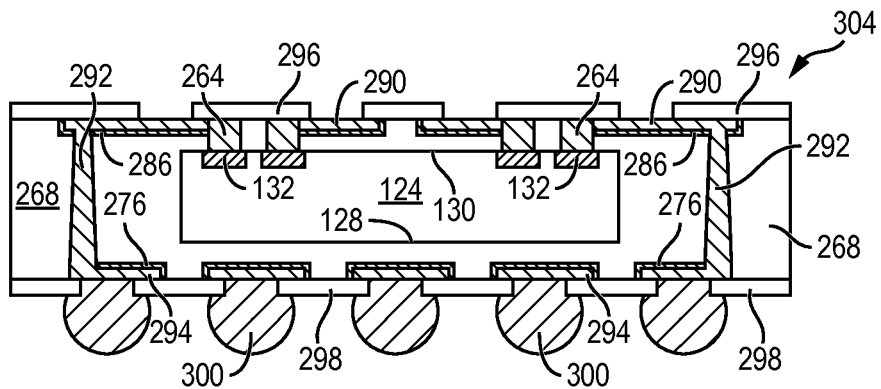
FIG. 15 illustrates the semiconductor die with conductive pillars, RDL, and vertical interconnect formed in accordance with FIG. 14a-14i.

Semiconductor die 124 are singulated through insulating layers 296 and 298 and encapsulant 268 with saw blade or laser cutting tool 302 into individual eWLB 304. FIG. 15 shows eWLB 304 after singulation. Semiconductor die 124 is oriented with back surface 128 toward bumps 300. Semiconductor die 124 is electrically connected to RDL 286, 290, RDL 276, 294, and bumps 300 for external interconnect. The eWLB 304 may undergo electrical testing before or after singulation. RDL 286, 290 and RDL 276, 294 are formed in part by LDS over semiconductor die 124. A laser-activated catalyst is infused or implanted within encapsulant 268. Laser 272 forms channels 274 in encapsulant 268 with conductive layer 276 engraved along a surface of the channels by laser radiation of the catalyst in the encapsulant. Conductive layer 294 is formed over conductive layer 276 within channels 274 as the LDS RDL 276, 294. Laser 282 forms channels 284 in encapsulant 268 with conductive layer 286 engraved along a surface of channels 284 by laser radiation of the catalyst in the encapsulant. Conductive layer 290 is formed over conductive layer 286 within channels 284 as the LDS RDL 286, 290. Conductive vias 292 electrically connect RDL 286, 290 and RDL 276, 294. The LDS RDL formation does not involve the extent of repassivation and seed layer sputtering, as described in the background, and requires fewer process steps by eliminating photolithography, mask stripping, and seed layer stripping. The LDS RDL achieves finer registration tolerances, finer line and space, process streamlining, lower equipment footprint, and less wet chemical processes, as well as a higher level of alignment compensation and flexibility in pattern adjustments without the masking found in the prior art.

Figure 16:
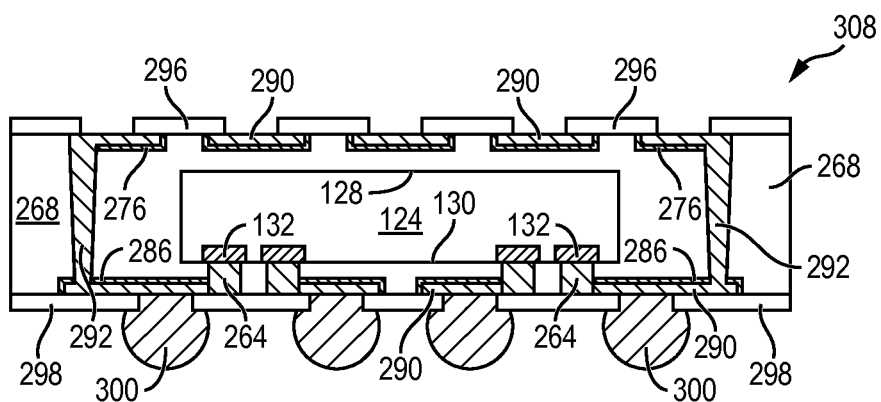
FIG. 16 illustrates another semiconductor die with conductive pillars, RDL, and vertical interconnect formed in an encapsulant by LDS.

FIG. 16 shows an embodiment of eWLB 308, similar to FIGS. 14a-14i, with semiconductor die 124 oriented active surface 130 toward bumps 300. Semiconductor die 124 is electrically connected to RDL 286, 290, RDL 276, 294, and bumps 300 for external interconnect.

Figure 17:
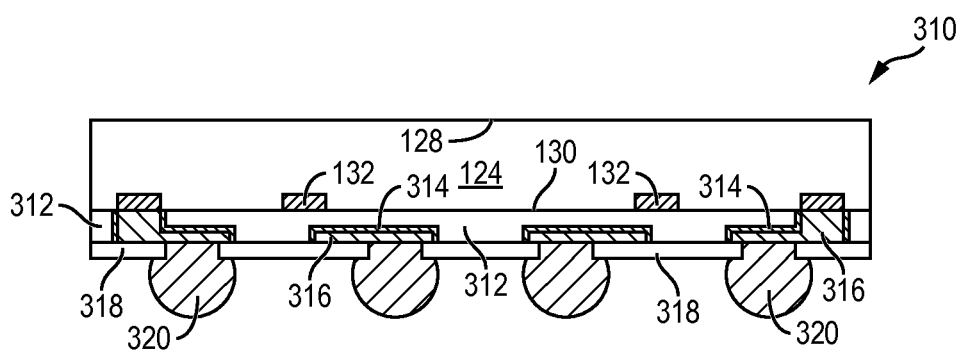
FIG. 17 illustrates a semiconductor die with an RDL formed in an insulating layer by LDS.

FIG. 17 shows an embodiment of eWLB 310 with an insulating or passivation layer 312 formed over semiconductor die 124 using PVD, CVD, printing, lamination, spin coating, or spray coating. The insulating layer 312 contains one or more layers of SiO2, Si3N4, SiON, Ta2O5, Al2O3, or other material having similar insulating and structural properties. Alternatively, insulating layer 312 can be an encapsulant or molding compound deposited over semiconductor die 124 using a paste printing, compressive molding, transfer molding, liquid encapsulant molding, vacuum lamination, spin coating, or other suitable applicator. The insulating layer 312 is infused or implanted with a laser-activated catalyst or particles that become conductive when exposed to IR laser radiation. In one embodiment, the laser structurable insulating layer 312 includes a laser-activated catalyst or particles embedded within the insulating layer. The catalyst is converted into an electrically conductive material by laser radiation.

A portion of insulating layer 312 is removed by LDA to form vias in the insulating layer to expose conductive layer 132. A portion of insulating layer 312 is removed by LDS to form channels in the insulating layer. The IR laser radiation also forms conductive layer 314 along a surface of the channels. The laser engraved channels become selectively conductive by formation of conductive layer or surface 314 upon application of the IR laser radiation.

An electrically conductive layer 316 is formed over conductive layer 314 within the channels and over conductive layer 132 using a deposition process such as sputtering, electrolytic plating, or electroless plating. Conductive layer 316 can be one or more layers of Al, Cu, Sn, Ni, Au, Ag, or other suitable electrically conductive material. Conductive layer 316 has a thickness of 5-20 μm, and may be recessed below the surface of insulating layer 312, or extend above the surface of the insulating layer. Conductive layers 314 and 316 operate as an RDL formed in part by LDS over semiconductor die 124. RDL 314-316 provides a conductive path extending from conductive layer 132 to other areas above semiconductor die 124 for bump formation and external interconnect. One portion of conductive layer 316 is electrically connected to conductive layer 132. Other portions of conductive layer 316 can be electrically common or electrically isolated depending on the design and function of semiconductor die 124.

An insulating or passivation layer 318 is formed over insulating layer 312 and conductive layer 316 using PVD, CVD, printing, lamination, spin coating, or spray coating. The insulating layer 318 contains one or more layers of SiO2, Si3N4, SiON, Ta2O5, Al2O3, solder resist, or other material having similar insulating and structural properties. A portion of insulating layer 318 is removed by etching or LDA to expose conductive layer 316.

An electrically conductive bump material is deposited over conductive layer 316 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 316 using a suitable attachment or bonding process. In one embodiment, the bump material is reflowed by heating the material above its melting point to form balls or bumps 320. In some applications, bumps 320 are reflowed a second time to improve electrical contact to conductive layer 316. In one embodiment, bumps 320 are formed over a UBM layer. Bumps 320 can also be compression bonded or thermocompression bonded to conductive layer 316. Bumps 320 represent one type of interconnect structure that can be formed over conductive layer 316. The interconnect structure can also use bond wires, conductive paste, stud bump, micro bump, or other electrical interconnect.

Semiconductor die 124 in eWLB 310 is electrically connected to RDL 314-316 and bumps 320 for external interconnect. The eWLB 310 may undergo electrical testing before or after singulation. RDL 314-316 are formed in part by LDS over semiconductor die 124. A laser-activated catalyst is infused or implanted within insulating layer 312. Channels are formed in insulating layer 312 with conductive layer 314 engraved along a surface of the channels by laser radiation of the catalyst in the encapsulant. Conductive layer 316 is formed over conductive layer 314 within the channels as the LDS RDL 314-316. The LDS RDL 314-316 formation does not involve the extent of repassivation and seed layer sputtering, as described in the background, and requires fewer process steps by eliminating photolithography, mask stripping, and seed layer stripping. The LDS RDL 314-316 achieves finer registration tolerances, finer line and space, process streamlining, lower equipment footprint, and less wet chemical processes, as well as a higher level of alignment compensation and flexibility in pattern adjustments without the masking found in the prior art.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor die;
    depositing an encapsulant over the semiconductor die;
    forming an insulating layer over the semiconductor die and encapsulant;
    forming a first channel and first conductive surface in the insulating layer by a first laser radiation;
    infusing a first catalyst in the insulating layer to form the first conductive surface upon the first laser radiation;
    forming a first conductive layer in the first channel over the first conductive surface; and
    forming a second channel and second conductive surface in the encapsulant by a second laser radiation.

2. The method of claim 1, further including:
    infusing a second catalyst in the encapsulant to form the second conductive surface upon the second laser radiation; and
    forming a second conductive layer in the second channel over the second conductive surface.

3. The method of claim 1, further including forming a vertical interconnect through the encapsulant.

4. The method of claim 1, further including forming a conductive pillar over the semiconductor die.

5. The method of claim 1, further including forming a bump over the semiconductor die.

6. A method of making a semiconductor device, comprising:
    providing a semiconductor die;
    depositing an encapsulant over the semiconductor die;
    forming a first channel and first conductive surface in the encapsulant by a first laser radiation;
    infusing a first catalyst in the encapsulant to form the first conductive surface upon the first laser radiation; and forming a first conductive layer in the first channel over the first conductive surface.

7. The method of claim 6, further including:
forming an insulating layer over the semiconductor die;
forming a second channel in the insulating layer by a second laser radiation; and
forming a second conductive layer in the second channel.

8. The method of claim 7, further including infusing a second catalyst in the insulating layer to form a second conductive surface in the second channel upon the second laser radiation.

9. The method of claim 6, further including forming an interconnect structure over the first conductive layer.

10. The method of claim 6, further including forming a conductive pillar over the semiconductor die.

11. The method of claim 6, further including forming a bump over the semiconductor die.

12. A method of making a semiconductor device, comprising:
providing a semiconductor die;
depositing an insulating material over the semiconductor die;
forming a first conductive surface in the insulating material by a first laser radiation;
infusing a first catalyst in the insulating material to form the first conductive surface upon the first laser radiation; and
forming a first conductive layer over the first conductive surface.

13. The method of claim 12, further including:
forming an insulating layer over the semiconductor die;
infusing a second catalyst in the insulating layer to form a second conductive surface in the insulating layer upon a second laser radiation; and
forming a second conductive layer over the second conductive surface.

14. The method of claim 12, further including forming an interconnect structure over the first conductive layer.

15. The method of claim 12, further including forming a vertical interconnect through the insulating material.

16. The method of claim 12, further including forming a conductive pillar over the semiconductor die.

17. A method of making a semiconductor device, comprising:
providing a semiconductor die;
depositing an insulating material over the semiconductor die;
forming a first conductive surface in the insulating material using a first laser radiation; and
infusing a catalyst in the insulating material to form the first conductive surface upon the first laser radiation.

18. The method of claim 17, further including forming a conductive layer over the first conductive surface.

19. The method of claim 18, wherein the conductive layer extends above a surface of the insulating material.

20. The method of claim 17, further including:
forming an insulating layer over the semiconductor die; and
forming a second conductive surface in the insulating layer by a second laser radiation; and
forming a conductive layer over the second conductive surface.

21. The method of claim 17, further including forming a vertical interconnect through the insulating material.

* * * * *